US012568646B2

(12) United States Patent
Müller-Meskamp et al.

(10) Patent No.: US 12,568,646 B2
(45) Date of Patent: Mar. 3, 2026

(54) SEMICONDUCTOR DEVICE WITH TRENCH ISOLATION STRUCTURES IN A TRANSITION REGION AND METHOD OF MANUFACTURING

(71) Applicant: Infineon Technologies Austria AG, Villach (AT)

(72) Inventors: Lars Müller-Meskamp, Dresden (DE); Ralf Rudolf, Dresden (DE); Annett Winzer, Dresden (DE); Christian Schippel, Dresden (DE); Thomas Künzig, Baldham (DE); Dirk Priefert, Moers (DE)

(73) Assignee: Infineon Technologies Austria AG, Villach (AT)

( * ) Notice: Subject to any disclaimer, the term of this patent is extended or adjusted under 35 U.S.C. 154(b) by 470 days.

(21) Appl. No.: 18/099,358

(22) Filed: Jan. 20, 2023

(65) Prior Publication Data

US 2023/0238459 A1 Jul. 27, 2023

(30) Foreign Application Priority Data

Jan. 27, 2022 (EP) ..................................... 22153674

(51) Int. Cl.
| | |
|---|---|
| *H10D 30/65* | (2025.01) |
| *H01L 21/762* | (2006.01) |
| *H10D 30/69* | (2025.01) |
| *H10D 62/10* | (2025.01) |
| *H10D 64/00* | (2025.01) |

(52) U.S. Cl.
CPC ..... *H10D 30/657* (2025.01); *H01L 21/76283* (2013.01); *H10D 30/795* (2025.01); *H10D 62/116* (2025.01); *H10D 64/111* (2025.01)

(58) Field of Classification Search
CPC ........ H01L 21/76283; H01L 21/76224; H10D 30/795; H10D 84/0188; H10D 62/115; H10D 30/657; H10D 12/441; H10D 62/105; H10D 84/85; H10D 62/124
See application file for complete search history.

(56) References Cited

U.S. PATENT DOCUMENTS

| | | |
|---|---|---|
| 2002/0043699 A1 | 4/2002 | Akiyama et al. |
| 2008/0124894 A1 | 5/2008 | Ham et al. |
| 2016/0276477 A1 | 9/2016 | Wada |
| 2020/0219928 A1 | 7/2020 | Park et al. |
| 2021/0028166 A1 | 1/2021 | Shin |
| 2022/0406886 A1* | 12/2022 | Chuang ................ H10D 30/657 |

* cited by examiner

*Primary Examiner* — Wasiul Haider
(74) *Attorney, Agent, or Firm* — Murphy, Bilak & Homiller, PLLC

(57) ABSTRACT

A semiconductor device includes a semiconductor layer, an electronic element and laterally separated trench isolation structures. The semiconductor layer includes an element region having an inner region, an outer region on opposite sides of the inner region, and a transition region that laterally separates the inner region and the outer region. The electronic element includes a first doped region formed in the inner region and a second doped region formed in the outer region. The trench isolation structures are formed at least in the transition region. Each trench isolation structure extends from a first surface of the semiconductor layer into the semiconductor layer.

19 Claims, 14 Drawing Sheets

SEMICONDUCTOR DEVICE WITH TRENCH ISOLATION STRUCTURES IN A TRANSITION REGION AND METHOD OF MANUFACTURING

TECHNICAL FIELD

Examples of the present disclosure relate to a semiconductor device usable in high-voltage applications and having a transition region for radial field distribution between an inner region and an outer region. In particular, the present disclosure relates to integrated circuits for power electronics.

BACKGROUND

HV (high-voltage) semiconductor devices in CMOS technology (complementary metal oxide semiconductors) form or include an interface between standard CMOS devices with input voltages below 5V on the one hand and industrial or consumer circuits operating at voltages above 30V on the other hand. Typical applications of such HV semiconductor devices are robotics, automotive and drivers for MEMS (micro electro mechanical systems). Typically, most of the signal processing is done at low operating voltage in a CMOS part and only the output signal interface and/or the input signal interface operates at higher signal levels and/or requires higher current driving and sinking capability. An example of such a HV semiconductor device is a gate driver circuit that enables a microcontroller or digital signal processor (DSP) to efficiently turn on and off power semiconductor switches.

There is a constant need to further improve the device characteristics of power electronics devices with little additional effort.

SUMMARY

Embodiments of the present disclosure relate to a semiconductor device having a transition region for lateral or radial field distribution between an inner region and an outer region. Trench isolation structures, particularly extending from a surface into the transition region, reduce charge carrier lifetime and contribute to faster removal of charge carriers from the transition region. Reverse recovery losses can be reduced and higher switching frequencies can be achieved.

To this purpose, an embodiment of the present disclosure relates to a semiconductor device that includes a semiconductor layer, an electronic element and laterally separated trench isolation structures. The semiconductor layer includes an element region having an inner region, an outer region on opposite sides of the inner region, and a transition region that laterally separates the inner region and the outer region. The electronic element includes a first doped region formed in the inner region and a second doped region formed in the outer region. The trench isolation structures are formed at least in the transition region. Each trench isolation structure extends from a first surface of the semiconductor layer into the semiconductor layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other.

FIG. 3 is a schematic horizontal cross-sectional view of a HV semiconductor device with an element isolation trench and with trench isolation structures formed in a lightly doped two-part transition region according to an embodiment.

FIG. 4 is a schematic horizontal cross-sectional view of a HV semiconductor device with an element isolation trench and with trench isolation structures formed in a lightly doped ring-shaped transition region according to an embodiment.

FIG. 15 is a schematic vertical cross-sectional view of a portion of a semiconductor device including a semiconductor diode having trench isolation structures formed in a transition region according to another embodiment.

FIG. 16 is a schematic vertical cross-sectional view of a portion of a semiconductor device including an MOSFET having trench isolation structures formed in a transition region according to another embodiment.

FIG. 17 is a schematic vertical cross-sectional view of a portion of a semiconductor device including several element regions according to a further embodiment.

DETAILED DESCRIPTION

Figures 1, 2:
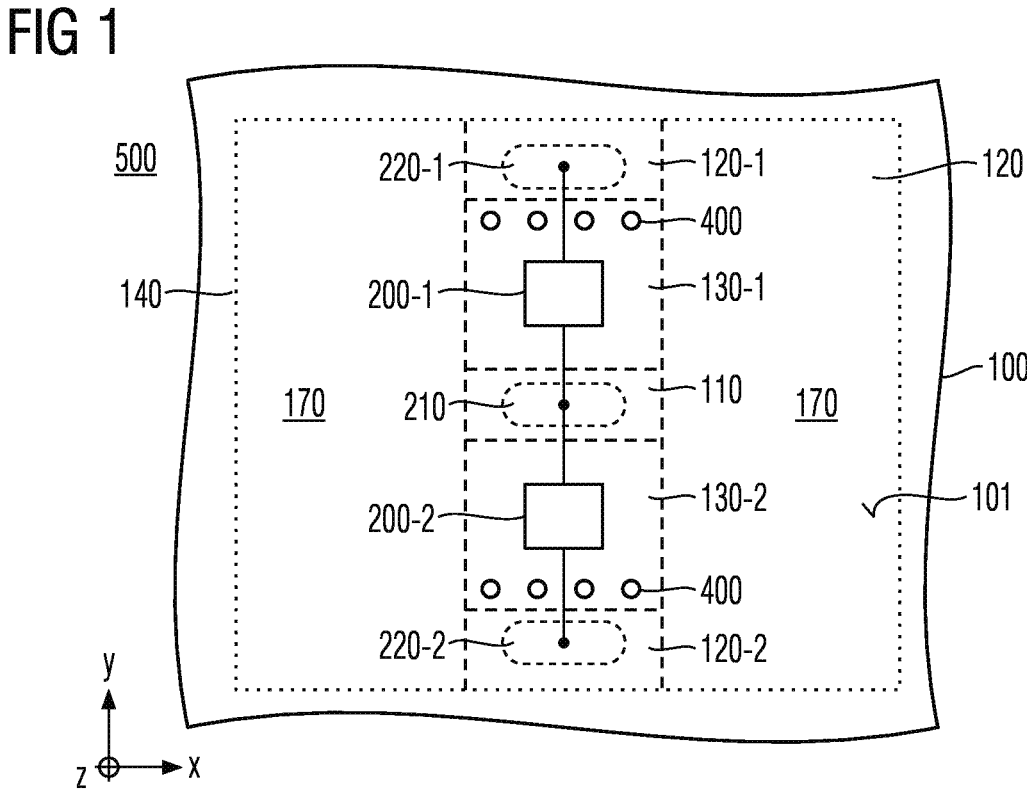
FIG. 1 is a schematic horizontal cross-sectional view of a HV semiconductor device with trench isolation structures formed in a lightly doped two-part transition region according to an embodiment.
FIG. 2 is a schematic horizontal cross-sectional view of a HV semiconductor device with trench isolation structures formed in a lightly doped ring-shaped transition region according to an embodiment.

In the following detailed description, reference is made to the accompanying drawings, which form a part hereof and in which are shown by way of illustrations specific embodiments in which a semiconductor device may be practiced. Other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30 V, for example 48 V, 100 V, 600 V, 1.6 kV, 3.3 kV or more and with a nominal on-state current or forward current of at least 200 mA, for example 1 A, 10 A or more.

MOSFETs (metal oxide semiconductor field effect transistor) are voltage controlled devices and include all types of IGFETs (insulated gate field effect transistors) with gate electrodes based on doped semiconductor material and/or metal and with gate dielectrics made of oxide and/or dielectric materials other than oxides.

An ohmic contact describes a non-rectifying electrical junction between two conductors, in particular between a semiconductor material and a metal. The ohmic contact has a linear or approximately linear current-voltage (I-V) curve in the first and third quadrant of the I-V diagram as with Ohm's law.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

An embodiment of the present disclosure relates to a semiconductor device that includes a semiconductor layer, an electronic element and laterally separated trench isolation structures. The semiconductor layer includes an element region having an inner region, an outer region on opposite sides of the inner region, and a transition region that laterally separates the inner region and the outer region. The electronic element includes a first doped region formed in the inner region and a second doped region formed in the outer region. The trench isolation structures are formed at least in the transition region. Each trench isolation structure extends from a first surface of the semiconductor layer into the semiconductor layer.

In particular, the semiconductor layer may have two substantially parallel main surfaces, which may have approximately the same shape and size. The semiconductor layer has a surface extent along two orthogonal axes (x-axis and y-axis) defining horizontal directions, and a thickness along a z-axis defining a vertical direction perpendicular to the horizontal directions. In the following, the horizontal directions are also referred to as lateral directions. The main surface at a front side of the semiconductor layer is referred to as the first surface.

The semiconductor layer may be a homogeneous semiconductor body of uniform thickness. Alternatively, the semiconductor layer may be part of an SOI (silicon-on-insulator) structure, wherein the semiconductor layer is formed on an insulator layer.

The semiconductor layer may include one single element region or two or more element regions, wherein the element regions may be assigned to different voltage domains. Each element region represents a laterally defined part of the semiconductor layer.

The inner region of an element region may have a compact outline or may be ring-shaped with an opening. The complete outer circumference of the inner region may include only straight and inwardly bound sections. Examples for a compact outline are circles, ovals, ellipses, rectangles with or without rounded corners. According to other examples, the outer circumference of the inner region may include one or more bulges and/or one or more indentations. For example, the inner region may be L-shaped or may include L-shaped parts connected to form a meandering structure. A ring-shaped inner region may surround an inner element region, wherein an insulator structure and/or an inner transition region may separate the inner region and the further element region.

The outer region of an element region may be a one-part structure that partly or completely surrounds the inner region. Alternatively, the outer region may include two or more laterally separated parts, wherein at least two of the separated parts are on opposite sides of the inner region. The laterally separated parts may be electrically connected through a low resistive ohmic connection or may be connected to different potentials.

The transition region of an element region is formed between the inner region and the outer region and may have a uniform lateral width. The transition region may be a one-part structure that partly or completely surrounds the inner region. Alternatively, the transition region may include two or more laterally separated parts, wherein at least two of the separated parts are on opposite sides of the inner region. The transition region may laterally separate the inner region and the outer region completely or at least along one or two horizontal directions. The transition region may include a lightly doped extension region for accommodating an electric field between the inner region and the outer region.

An interface between the transition region and the inner region is defined by a first lateral semiconductor junction, which may be a pn junction or a unipolar junction at the first surface. An interface between the transition region and the outer region is defined by a second lateral semiconductor junction, which may be a pn junction or unipolar junction, at the first surface.

An element region which outer region includes laterally separated parts may further include termination regions for electric field management in portions of the element regions with no outer region formed directly between the inner region and the outer edge of the element region.

The electronic element may functionally couple the first doped region and the second doped region. For example, the electronic element may be a passive component such as a capacitor or a resistor, e.g. an electronic element with temperature dependent resistance, a circuit field plate or another field shaping structure. Alternatively, the electronic element may be an active component configured to block a voltage applied between the first doped region and the second doped region in a first state and to conduct a current between the first doped region and the second doped region in a second state. For example, the electronic element may be a semiconductor diode, e.g. a protection device (ESD diode or snubber diode), or a Schottky diode. According to another example, the electronic element may be an electronic switch, e.g. an insulated gate field effect transistor such as an nMOSFET (n-channel MOSFET), a pMOSFET (p-channel MOSFET), an LDMOSFET (laterally diffused MOSFET), or an insulated gate bipolar transistor (IGBT). A blocking voltage of the electronic element may be at least 48V, at least 60V, at least 600V, at least 650V, at least 800V or at least 1200V, by way of example. The semiconductor device may include one, two or more electronic elements formed in the same or in different element regions. The electronic element may include a circuit including two or more functional elements such as a diode chain with two or more semiconductor diodes electrically connected in series between the inner region and the outer region.

The trench isolation structures extend from a first surface at a front side of the semiconductor layer into the semiconductor layer. The trench isolation structures may be formed exclusively in the transition region, wherein the trench isolation structures may be laterally spaced from the inner region, from the outer region or from both the inner region and the outer region. Alternatively, the trench isolation structures may be formed in the transition region and the inner region, or in the transition region and the outer region, or in each of the transition region, the inner region, and the outer region.

The trench isolation structures may be arranged in a regular pattern at regular mean distances, e.g., at nodes of a grid with rectangular or hexagonal meshes. The trench isolation structures may be arranged in a pattern with rotational symmetry with respect to the inner region. According to another example, the trench isolation structures may be arranged in an irregular pattern that appears random. Along the first surface, a total horizontal cross-sectional area of the trench isolation structures may occupy 2% to 20% of the total horizontal area of the element region, or of the semiconductor layer.

The trench isolation structure may have approximately vertical sidewalls. For example, the sidewalls of the trench isolation structure may be vertical or a tilt angle between each sidewall and the z-axis is less than 15 degree.

A vertical extension of the trench isolation structure may be greater than the vertical extension of each implanted and/or diffused doped region extending from the first surface at the front side of the semiconductor layer into the transition region, the inner region and the outer region.

The trench isolation structure may include one or more layers of dielectric materials, e.g. thermal silicon oxide, deposited silicon oxide, silicon nitride, silicon oxynitride, doped or undoped silicate glass and/or a dielectric polymer. Alternatively, the trench isolation structure may include one or more conductive layers. The trench isolation structure may be completely filled with solid material or may include an intentional air gap.

The surface of the trench isolation structures provides additional recombination centers for charge carriers, shorten the lifetime of mobile charge carriers and in this way facilitate a faster removal of charge carriers from the semiconductor layer.

According to an embodiment, the semiconductor device may further include an insulator layer, wherein the semiconductor layer is formed on the insulator layer.

The semiconductor layer and the insulator layer may form or may be part of an SOI structure. The semiconductor layer may be a layer of uniform thickness, wherein a thickness of the semiconductor layer along the vertical direction may be in a range from 20 μm to 200 μm. The material of the semiconductor layer is a single-crystalline semiconductor, e.g. single-crystalline silicon.

The insulator layer may be a homogenous layer or may include two or more vertically stacked sub-layers of different composition and/or structure. For example, the insulator layer may include a silicon oxide layer, a silicon nitride layer, and/or a siliconoxynitride layer. The insulator layer may have a vertical extension v2 in a range from 500 nm to 20 μm. A voltage blocking capability of the insulator layer may be in a range from 200V to 1500V, e.g., about 300V.

The semiconductor device may be formed with no further single-crystalline semiconductor material at a side of the insulator layer opposite to the semiconductor layer. In particular, the semiconductor device can be formed without any layer on the side of the insulator layer opposite to the semiconductor layer.

According to some examples, the insulator layer may separate the semiconductor layer from a non-insulating base. The non-insulating base may be or may include a semiconductor substrate. The semiconductor substrate may be homogenously doped or may include doped regions extending from the interface with the insulator layer into the semiconductor substrate. Alternatively, a layer or a layer stack that does not include an active semiconductor material can be formed on the side of the insulator layer opposite to the semiconductor layer, e.g. a layer or layer stack that includes a semi-metal layer like a polycrystalline silicon layer and/or a metal layer. Alternatively, the non-insulating base is free of semiconducting materials. For example, the non-insulating base may include or consist of a metal plate and/or a metal layer.

The insulator layer and the semiconductor layer are vertically stacked on the non-insulating base along the z-axis in this order.

For a non-insulating base without single-crystalline semiconductor material, a vertical extension of the insulator layer may be in a range from 500 nm to 25 μm and the thickness of the semiconductor layer may be in a range from 500 nm to 200 μm.

For a non-insulating base including single-crystalline semiconductor material, a vertical extension of the insulator layer may be in a range from 50 nm to 500 nm and the thickness of the semiconductor layer may be in a range from 200 nm to 3 μm.

According to an embodiment, the outer region may surround the inner region.

In particular, the transition region may completely surround the inner region and the outer region may completely surround the inner region and the transition region. The width of the transition region may be uniform across the complete circumference of the inner region. Accordingly, a distance between the inner region and the outer region may be uniform across the complete circumference of the transition region.

According to an embodiment, the semiconductor device may further include an element isolation trench surrounding the element region.

In particular, the element isolation trench is a partly or completely filled trench that may form a closed ring around the outer region, e.g. a circular ring, an oval ring, a rectangular ring or a ring with two semicircular and two straight sections. The element isolation trench may be a contiguous moat trench of uniform width extending from the first surface at a front side of the semiconductor layer into the semiconductor layer.

The element isolation trench may extend down to or into the insulator layer. For example, a vertical extension of the element isolation trench may be equal to or greater than 50%, greater than 60% or 80% of a vertical extension v1 of the semiconductor layer. The element isolation trench significantly reduces leakage currents into or out of the element region.

According to an embodiment, the semiconductor device may further include a further element region surrounded by the inner region.

In particular, the inner region may be ring-shaped with an opening, in which the further element region is formed. An inner isolation trench and/or an inner transition region may separate the inner region and the further element region. The inner isolation trench may be a ring around the further element region, e.g. a circular ring, an oval ring, a rectangular ring or a ring with two semicircular and two straight sections, by way of example. The inner isolation trench may be moat trench extending from the first surface at the front side of the semiconductor layer into the semiconductor layer.

According to an embodiment, a vertical extension v6 of at least some of the trench isolation structures may be greater than a vertical extension v4 of the first doped region and a vertical extension v5 of the second doped region. In this way, a great portion of the surface of the trench isolation structures is in the bulk portion and can highly efficiently contribute to charge carrier recombination.

According to an embodiment, a lateral area occupation density of the trench isolation structures may be uniform, wherein the area occupation density is the ratio of the total area occupied by the horizontal cross-sections of the trench isolation structures in a unit area and the total horizontal cross-sectional area of the unit area.

According to an embodiment, a lateral area occupation density of the trench isolation structures may decrease with decreasing distance to the inner region.

According to an embodiment, a roundness of a horizontal cross-sectional area of the trench isolation structures may be at least 0.4.

The roundness is the ratio between the inscribed circle of the horizontal cross-sectional area and the circumscribed circle of the horizontal cross-sectional area of an isolation trench structure. For example, the horizontal cross-sectional area is a rectangle with a ratio of length to width of 2 and with a roundness of 0.45. In particular the roundness is at least 0.7, e.g. a square (roundness 0.71), or equal 1, i.e. a circle (roundness 1). A mean radius r1 of each of the trench isolation structures in the plane of the first surface may be in a range from 100 nm to 20 μm.

According to an embodiment, a horizontal cross-sectional area of the trench isolation structures is a stripe with a lateral longitudinal extension l1 exceeding at least two times a mean lateral width extension w1.

For example, the horizontal cross-sectional area of the trench isolation structures may be wedge-shaped with the lateral width tapering in direction of the inner region.

In particular, a lateral width of the trench isolation structures may decrease with decreasing distance to the inner region.

Alternatively, the horizontal cross-sectional areas of the trench isolation structures may have approximately uniform width along the lateral longitudinal extension.

In particular, horizontal longitudinal axes of the trench isolation structures may extend in radial direction along straight connection lines between the inner region and the outer region.

According to an embodiment, at least one of the trench isolation structures is formed in the inner region or in the outer region.

For example, additional trench isolation structures may be formed in a portion of the inner region adjacent to the semiconductor junction between the inner region and the transition region. Alternatively or in addition, additional trench isolation structures may be formed in a portion of the outer region adjacent to the semiconductor junction between the outer region and the transition region.

According to an embodiment, the semiconductor device may further include intrinsic recombination centers formed in the semiconductor layer in a layer portion along an interface between the trench isolation structure and the semiconductor layer.

The intrinsic recombination centers may be or may include atomic impurities e.g. electrically active dopants such as donor and acceptor atoms, foreign atoms of a further semiconductor element, and electrically less active or inactive impurities such as platinum atoms. Alternatively or in addition, the intrinsic recombination centers may include crystal defects in the semiconductor layer, e.g. bulk defects, planar defects, line defects and point defects like interstitial defects, substitutional defects and vacancy defects. The intrinsic recombination centers further contribute to charge carrier recombination.

According to an embodiment, the semiconductor device may further include interface recombination centers formed along an interface between the trench isolation structures and the semiconductor layer.

The interface recombination centers may be in contact with both the trench isolation structure and the semiconductor layer. The interface recombination centers may include metal atoms, atomic metal clusters, metal nanoparticles or a discontinuous metal layer. The interface recombination centers further contribute to charge carrier recombination.

According to an embodiment, the trench isolation structures may include a dielectric portion in direct contact with the semiconductor layer.

In particular, the dielectric portion may include a sidewall layer that includes one or more layers of dielectric materials, e.g. thermal silicon oxide, deposited silicon oxide, silicon nitride, silicon oxynitride, doped or undoped silicate glass and/or a dielectric polymer. The trench isolation structure can consist of the dielectric portion. Alternatively, the trench isolation structure may further include a conductive fill portion, wherein the dielectric portion separates the conductive fill portion and the semiconductor layer.

According to an embodiment, the electric element may be or may include a semiconductor diode, wherein the first doped region forms at least part of a first electrode region of the semiconductor diode, wherein the second doped region forms at least part of a second electrode region of the semiconductor diode, and wherein the first and second electrode regions form a pn junction.

The pn junction may be formed in the transition region. In particular, the first electrode region may include a heavily doped first contact region in the inner region and a lightly doped first extension region extending from the heavily doped first contact region into direction of the second electrode region and/or the second electrode region may include a heavily doped second contact region in the outer region and a lightly doped second extension region extending from the heavily doped second contact region into direction of the first electrode region.

The first doped region may be n doped and may form the cathode region and the second doped region may be p doped and may form the anode region of the semiconductor diode. Alternatively, the second doped region may be n doped and may form the cathode region and the first doped region may be p doped and may form the anode region of the semiconductor diode.

According to an embodiment, the electric element may be or may include an insulated gate field effect transistor, wherein the first doped region forms at least part of a first source/drain region, wherein the second doped region forms at least part of a second source/drain region, and wherein in an on-state of the insulated gate field effect transistor a charge carrier channel connects the first and second source/drain regions.

The insulated gate field effect transistor may further include a lightly doped drain extension region and a body region. The drain extension region forms a unipolar junction with one of the first and second source/drain regions. The body region separates the drain extension region from the other one of the first and second source/drain regions.

For example, the first electric element is an enhancement-type LDMOSFET and the body region has a conductivity type opposite to the conductivity type of the first and second source/drain regions. The first doped region may form the complete first source/drain region or a part thereof. The second doped region may form the complete second source/drain region or a part thereof. The first and second doped regions may be n doped. Alternatively, the first and second doped regions may be p doped.

Another embodiment is related to a method of forming a semiconductor device. A semiconductor layer is formed that includes an element region, wherein the element region includes an inner region, an outer region on opposite sides of the inner region, and a transition region laterally separating the inner region and the outer region. The method further includes forming an electronic element that includes a first doped region formed in the inner region and a second doped region formed in the outer region, wherein the electronic element is configured to temporarily block a voltage applied between the first doped region and the second doped region. The method further includes forming laterally separated trenches extending from a first surface of the semiconductor layer into the transition region and further includes forming trench isolation structures in the trenches.

According to an embodiment, the method may further include forming intrinsic recombination centers by introducing atoms through sidewalls of the trenches.

The atoms may be introduced by ion implanting through the sidewalls of the trenches and/or by thermal doping from the solid phase or from the gaseous phase, including e.g. plasma assisted deposition techniques. The dopants may be electrically active donors and acceptor atoms, foreign semiconductor atoms (e.g. Ge in Si), metal atoms and/or damage atoms that generate crystal defects when ion-implanted through the trench sidewalls.

According to an embodiment, the method may further include forming a layer that contains a metal on sidewalls of the trenches.

According to an embodiment, the method may further include forming a stress layer on sidewalls of the trenches, wherein the stress layer induces mechanical stress into portions of the semiconductor layer around the trenches.

Each of FIG. 1 and FIG. 2 show a first surface 101 of a semiconductor layer 100 on the front side of a semiconductor device 500. The first surface 101 is planar and extends along two orthogonal axes (x-axis and y-axis) defining horizontal directions. The semiconductor layer 100 has a thickness along a z-axis defining a vertical direction perpendicular to the horizontal directions. In the following, the horizontal directions are also referred to as lateral directions.

The semiconductor layer 100 may be a homogeneous semiconductor body of uniform thickness, wherein a thickness of the semiconductor layer 100 along the z-axis may be in a range from 50 μm to 775 μm. Alternatively, the semiconductor layer 100 may be part of an SOI (silicon-on-insulator) structure, wherein the semiconductor layer 100 is formed on an insulator layer. The material of the semiconductor layer 100 is a single-crystalline elemental semiconductor or compound semiconductor, for example silicon (Si) or silicon germanium (Site).

The semiconductor layer 100 includes an element region 140 having an inner region 110, an outer region 120 on opposite sides of the inner region 110, and a transition region 130 that laterally separates the inner region 110 and the outer region 120. The transition region 130 is formed between the inner region 110 and the outer region 120 and has a uniform lateral width. An interface between the transition region 130 and the inner region 110 is defined by a first lateral semiconductor junction, which may be a pn junction or a unipolar junction at the first surface 101. An interface between the transition region 130 and the outer region 120 is defined by a second lateral semiconductor junction, which may be a pn junction or unipolar junction, at the first surface 101.

In FIG. 1, the inner region 110 has a compact horizontal outline forming a rectangle, wherein the complete outer circumference of the inner region 110 includes only straight sections. The outer region includes two laterally separated parts 120-1, 120-2 on opposite sides of the inner region 110, wherein the laterally separated parts 120-1, 120-2 may be electrically connected through a low resistive ohmic connection. The transition region includes two laterally separated parts 130-1, 130-2 on opposite sides of the inner region 110. The first part 130-1 of the transition region laterally separates the inner region 110 and the first part 120-1 of the outer region along the y-axis. The second part 130-2 of the transition region laterally separates the inner region 110 and the second part 120-2 of the outer region along the y-axis.

Termination regions 170 for electric field management are formed in portions of the element regions 140 with no outer region formed directly between the inner region 110 and the outer edge of the element region 140. Each termination region 170 may mainly consist of a lightly doped region which may be n conductive or p conductive, or which may mainly consist of lightly doped regions of both conductivity types.

The first lateral semiconductor junction between the transition region and the inner region 110 has two laterally separated portions. The second lateral semiconductor junction between the transition region and the outer region 120 has two laterally separated portions.

In FIG. 2, the outer circumference of the inner region 110 includes two parallel straight sections and two inwardly bound sections, e.g. semicircular sections that connect the straight sections. The outer region 120 is a one-part structure that completely surrounds the inner region 110. The transition region 130 is a one-part structure that completely surrounds the inner region 110. The transition region 130 laterally separates the inner region 110 and the outer region completely in the radial direction.

The first lateral semiconductor junction between the transition region 130 and the inner region 110 is a contiguous structure. The second lateral semiconductor junction between the transition region 130 and the outer region 120 is a contiguous structure.

For both semiconductor devices 500 in FIG. 1 and FIG. 2, the transition region 130 may include a lightly doped extension region for accommodating an electric field between the inner region 110 and the outer region 120.

In a blocking state of the semiconductor device, the blocking voltage drops across the transition region 130 between a conductive structure in the outer region 120 and a conductive structure in the inner region 110. The transition region 130 reduces the electric field effective between the inner region 110 and the outer region 120, wherein a lateral extension of the transition region 130 and a dopant concentration in the transition region 130 are selected such that for the nominal blocking voltage the maximum electric field strength is safely below the breakdown field strength of the transition region 130.

The semiconductor device 500 further includes an electronic element 200 having a first doped region 210 formed in the inner region 110 and a second doped region 220 formed in the outer region 120.

The electronic element 200 may functionally couple the first doped region 210 and the second doped region 220. For example, the electronic element 200 may be a passive component such as a capacitor or a resistor, an electronic element with temperature dependent resistance, a circuit field plate or another field shaping structure. Alternatively, the electronic element 200 may be an active component configured to block a voltage applied between the first doped region 210 and the second doped region 220 in a first state and to conduct a current between the first doped region 210 and the second doped region 220 in a second state. For example, the electronic element 200 may be a semiconductor diode, e.g. a protection device (ESD diode or snubber diode), or a Schottky diode. According to another example, the electronic element may be an electronic switch, e.g. an insulated gate field effect transistor such as an nMOSFET, a pMOSFET, an LDMOSFET, or an IGBT. The semiconductor device 500 may include one, two or more electronic elements 200 formed in the same or in different element regions 140. Each electronic element 200 may include a circuit including two or more functional elements such as a diode chain with two or more semiconductor diodes electrically connected in series between the inner region 110 and the outer region 120.

In case the semiconductor device 500 is a half bridge gate driver, the electronic element 210 may be a bootstrap diode for supplying electric power to at least one of the HV parts formed in the inner region 110 and the outer region 120 or a level-shift transistor to transfer signal levels of control signals for one or the HV parts.

In FIG. 1, the second doped region includes a first part 220-1 formed in the first part 120-1 of the outer region 120 and a second part 220-2 formed in the second part 120-2 of the outer region 120. The electronic element includes a first part 200-1 including the first part 220-1 of the second doped region and a second part 200-2 including the second part 220-2 of the second doped region.

FIG. 1 and FIG. 2 further show trench isolation structures 400 extending from the first surface 101 at the front side of the semiconductor layer 100 into the semiconductor layer 100. The trench isolation structures 400 are formed in the transition region 130 closer to the outer region 120 than to the inner region 110. The horizontal cross-sections of the trench isolation structures 400 are circles. The trench isolation structures 400 are formed at uniform lateral distances and have a same horizontal cross-sectional area. The trench isolation structures 400 provide additional recombination centers for charge carriers. Furthermore, the trench isolation structures 400 in the horizontal cross-section are fully surrounded by the transition region 130. Furthermore, the trench isolation structures 400 are fully surrounded by a portion of the transition region 130 associated with the electronic element 200. More particular, the trench isolation structures 400 (in the horizontal cross-section) are fully surrounded by a respective portion of the transition region 130 associated with the respective part 200-1, 200-2 of the electronic element 200.

Figures 3, 4:
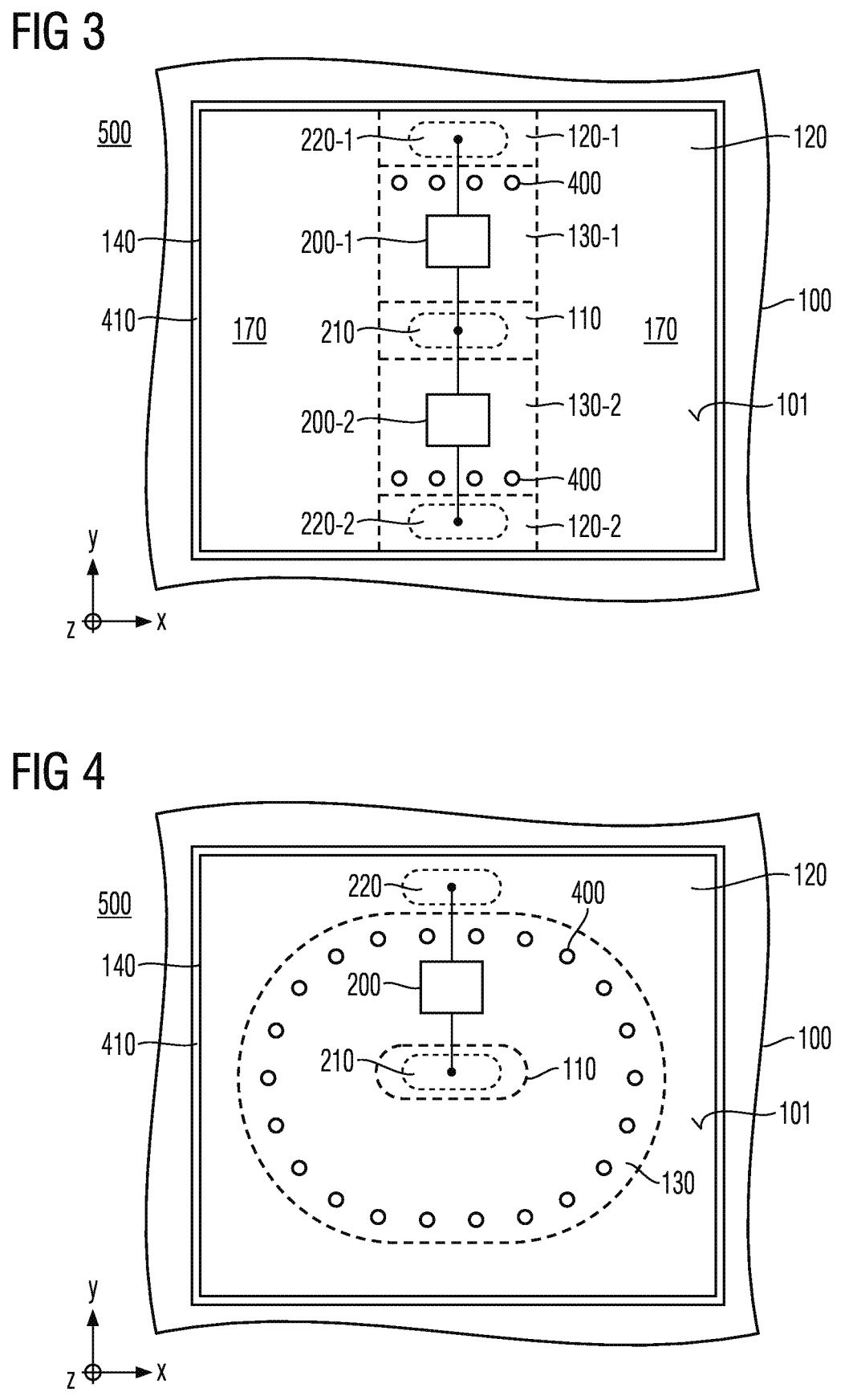

FIG. 3 shows an element isolation trench 410 surrounding an element region 140 with an inner region 110, a transition region including a first part 130-1 and a second part 130-2, and an outer region including a first part 120-1 and a second part 120-2 as described with reference to FIG. 1.

FIG. 4 shows an element isolation trench 410 surrounding an element region 140 with an inner region 110, a one-part transition region 130, and a one-part outer region 120 as described with reference to FIG. 2.

In both FIG. 3 and FIG. 4, the element isolation trench 410 forms a closed rectangular ring around the outer region 120. The element isolation trench 410 is a contiguous moat trench of uniform width extending from the first surface 101 into the semiconductor layer 100. The element isolation trench 410 is completely or partially filled and contains materials other than the material of the semiconductor layer 100, e.g. one or more dielectric materials.

Figures 5A, 5B:
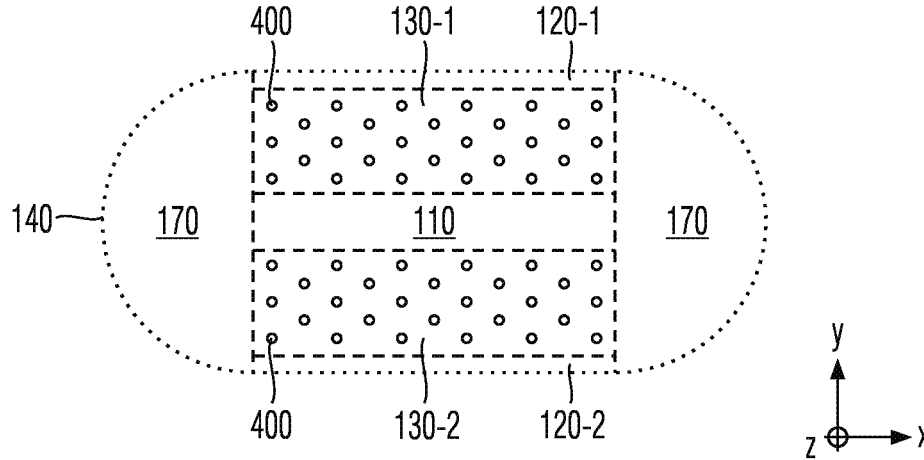
FIG. 5A is a schematic horizontal cross-sectional view of a HV semiconductor device with trench isolation structures formed in a lightly doped ring-shaped transition region and with a further element region surrounded by an inner region according to an embodiment.
FIG. 5B is a schematic horizontal cross-sectional view of a HV semiconductor device with trench isolation structures formed in a lightly doped two-part transition region and with doped termination regions adjacent to the transition region according to an embodiment.

FIG. 5A shows a semiconductor device 500 with the inner region 110 surrounding a further element region 140. In particular, the inner region 110 is ring-shaped and has an opening, in which the further element region 140 is formed. The further element region 140 may include an inner isolation trench 430 that separates the inner region 110 and a semiconducting portion of the further element region 140. The inner isolation trench 430 is a ring with two semicircular and two straight sections. The inner isolation trench 430 is moat trench extending from the first surface 101 at the front side of the semiconductor layer 100 into the semiconductor layer 100. The further element region 140 may be associated with a separated voltage domain. The trench isolation structures 400 are evenly distributed within the transition region 130.

The element region 140 shown in FIG. 5B includes an inner region 110, a transition region including a first part 130-1 and a second part 130-2, and an outer region including a first part 120-1 and a second part 120-2 as described with reference to FIG. 1, wherein the first part 130-1 of the transition region separates the first part 120-1 of the outer region along the y-axis from the inner region 110, and wherein the second part 130-2 of the transition region separates the second part 120-2 of the outer region along the y-axis from the inner region 110. Semicircular termination regions 170 for electric field management separate the inner region 110, the first part 130-1 of the transition region, and the second part 130-2 of the transition region along the x-axis from the edge of the element region 140.

Figure 6:
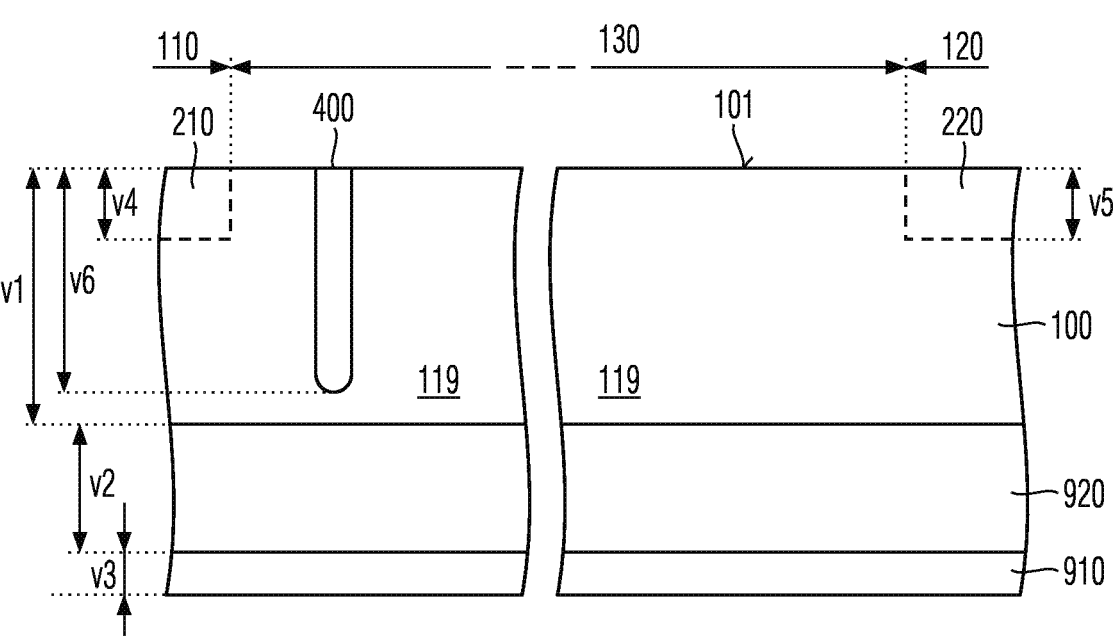
FIG. 6 is a schematic vertical cross-sectional view of a portion of an SOI (silicon-on-insulator) semiconductor device with a trench isolation structure according to an embodiment.

In FIG. 6, the semiconductor layer 100 is part of an SOI (semiconductor-on-insulator) structure. An insulator layer 920 is formed on a non-insulating base 910. The semiconductor layer 100 is formed on the insulator layer 920. The non-insulating base 910, the insulator layer 920 and the semiconductor layer 100 are vertically stacked on each other and form the SOI structure.

The non-insulating base 910 may be or may include a semiconductor substrate, wherein the semiconductor substrate may be homogenously doped or may include doped regions extending from the interface with the insulator layer 920 into the semiconductor substrate. Alternatively or in addition, the non-insulating base 910 may include a metal plate or a metal layer.

The insulator layer 920 separates the semiconductor layer 100 from the non-insulating base 910. The insulator layer 920 has a uniform vertical extension v2 and may be a homogenous, dielectric layer, e.g. a silicon oxide layer. Alternatively, the insulator layer 920 may include two or more vertically stacked sub-layers of different composition and/or structure. The vertical extension v2 may be in a range from 200 nm to 800 nm, e.g., from 350 nm to 450 nm. Alternatively, for example in the absence of the non-insulating base 910, the vertical extension v2 is in a range from 1 μm to 20 μm, e.g., from 1 μm to 10 μm. A voltage blocking capability of the insulator layer 920 may be in a range from 200V to 1500V, e.g., about 300V.

The semiconductor layer 100 may be a layer of uniform thickness, wherein a vertical extension v1 of the semiconductor layer 100 along the z-axis may be in a range from 50 nm to 20 μm, e.g. in a range from 100 nm to 1 μm.

In particular, the semiconductor device 500 may be a PDSOI (partially depleted SOI) device, wherein doped regions 210, 220 of electronic elements are formed as doped wells extending from the first surface 101 at the front side of the semiconductor layer 100 into an upper portion of the semiconductor layer 100. The inner edges of the pn junctions of the first and second doped regions 210, 220 at the first surface 101 define the edges of the transition region 130. A bulk portion 119 of the semiconductor layer 100 separates the doped regions 210, 220 from the insulator layer 920. The vertical extension v1 of the semiconductor layer 100 of PDSOI devices is in a range from 10 μm to 220 μm, for example in a range from 20 μm to 140 μm.

According to another example (not illustrated), the semiconductor device is an FDSOI (fully depleted SOI) device, wherein doped regions 210, 220 of the electronic elements extend from the first surface 101 down to the insulator layer 920. A vertical extension v1 of the semiconductor layer 100 of an FDSOI device may be in a range from 20 nm to 500 nm.

The illustrated trench isolation structure 400 has vertical sidewalls. More trench isolation structures with the same dimensions and material configuration may extend from the first surface 101 into the semiconductor layer 100.

The trench isolation structures 400 may extend down to or into the insulator layer 920 or may end in the semiconductor layer 100 at a distance to the insulator layer 920. In particular, the trench isolation structures 400 end in the bulk portion 119 between a lower edge of the first and second doped regions 210, 220 and the insulator layer 920. A vertical extension v6 of at least some of the trench isolation structures 400 may be less than the vertical extension v1 of the semiconductor layer 100, e.g., equal to or less than 80%, less than 60% or less than 50% of a vertical extension v1 of the semiconductor layer 100.

The vertical extension v6 of at least some of the trench isolation structures 400 may be greater than the vertical extension of any doped region implanted and/or diffused from the first surface 101 into the transition region 130, the inner region 110 and the outer region 120. In particular, the vertical extension v6 of at least some of the trench isolation structures 400 may be equal to or greater than 150%, greater than 200% or greater than 300% of a vertical extension of the doped region 210, 220 extending deeper into the semiconductor layer 100.

In case the semiconductor device includes shallow trench isolations (STI) formed along the first surface 101 and partially extending into the semiconductor layer 100, the trench isolation structures 400 extend deeper into the semiconductor layer 100 than the shallow trench isolations, e.g., at least twice as deep.

The trench isolation structures 400 can have different vertical extensions, wherein the vertical extension can be adjusted by the size of the cross-sectional area of the trench isolation structure in combination with a trench etching method that is more efficient the larger a cross-sectional area of an etched trench is.

At a suitable ratio of the cross-sectional area of the trench isolation structures 400 and the element isolation trench 410, the trenches for both the trench isolation structures 400 and the element isolation trench 410 may be formed simultaneously in the same etch process, wherein the trench for the element isolation trench 410 exposes the insulator layer 920 and the trenches for the trench isolation structures 400 end in the semiconductor layer 100 at a distance to the insulator layer 920.

FIG. 7 to FIG. 12 show circular element regions 140 with a circular inner region 110, a ring-shaped outer region 120, and a ring-shaped transition region 130 laterally separating the inner region 110 and the outer region 120. If an irregular lateral distribution of trench isolation structures 400 is shown it may be replaced with a regular distribution, and if a regular lateral distribution is shown, it may be replaced with an irregular distribution. At least some of the trench isolation structures 400 in the horizontal cross-section are fully surrounded by the transition region 130. More particular, at least some of the trench isolation structures 400 (in the horizontal cross-section) are fully surrounded by a portion of the transition region 130 part of or associated with the specific electronic element 200.

Figure 7:
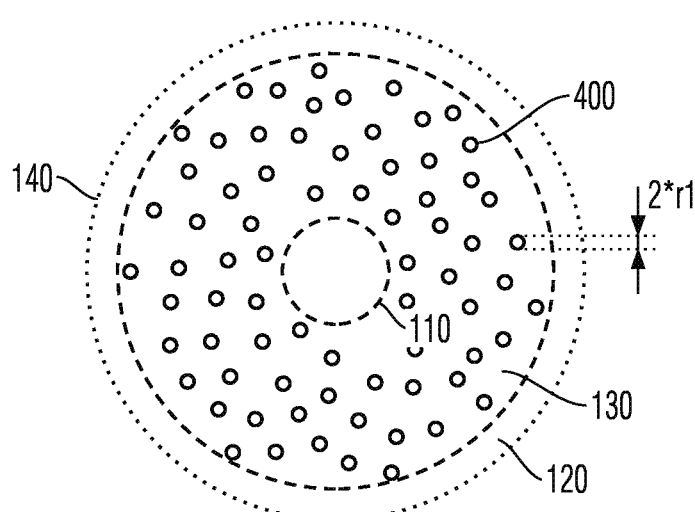
FIG. 7 is a schematic horizontal cross-sectional view of a semiconductor device according to an embodiment having trench isolation structures with circular horizontal cross-section and with uniform horizontal area occupation density in a ring-shaped transition region.

In FIG. 7, the trench isolation structures 400 have circular horizontal cross-sectional areas of the same size. The trench isolation structures 400 are exclusively formed in the transition region 130 and are roughly evenly distributed.

Figure 8:
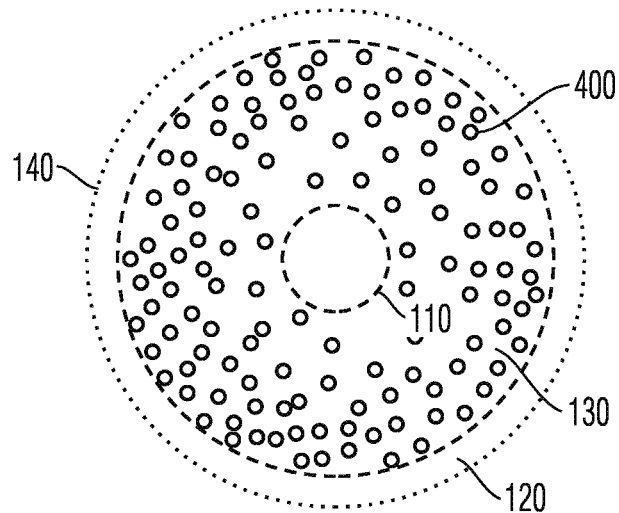
FIG. 8 is a schematic horizontal cross-sectional view of a semiconductor device according to an embodiment having trench isolation structures with circular horizontal cross-section and with non-uniform horizontal area occupation density in a ring-shaped transition region.

In FIG. 8, a lateral area occupation density of the trench isolation structures 400 decreases with decreasing distance to the inner region 110.

Figure 9:
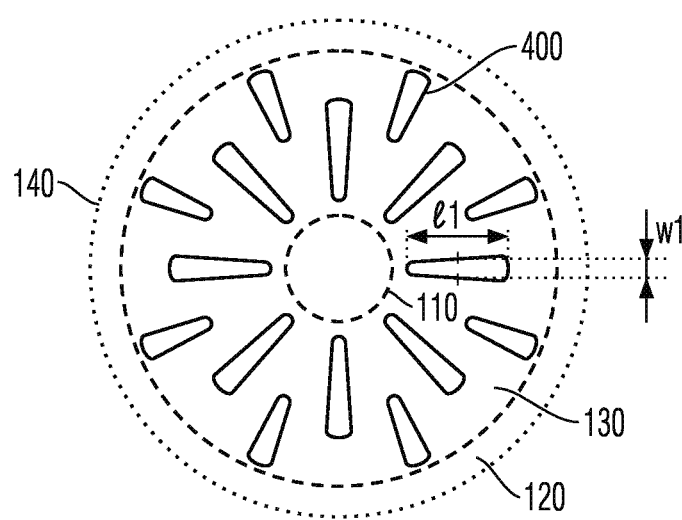
FIG. 9 is a schematic horizontal cross-sectional view of a semiconductor device according to an embodiment having trench isolation structures with wedge-shaped horizontal cross-sections.
Figure 10:
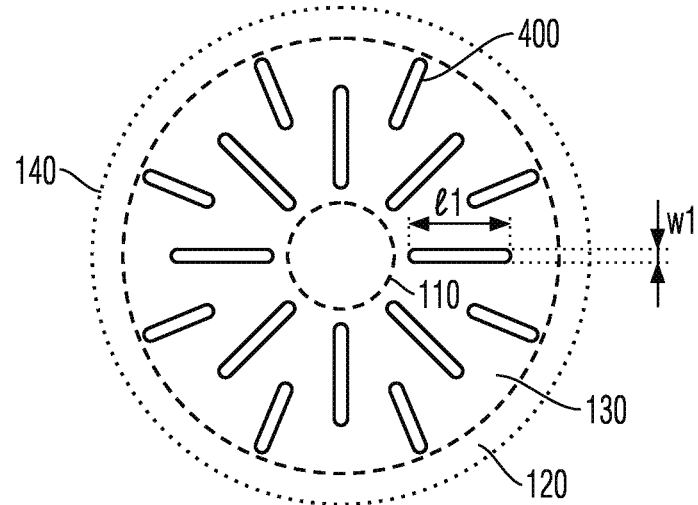
FIG. 10 is a schematic horizontal cross-sectional view of a semiconductor device according to an embodiment having trench isolation structures with radially oriented stripe-shaped horizontal cross-sections.

FIG. 9 and FIG. 10 show trench isolation structures 400 with horizontal cross-sectional areas forming stripes with a lateral longitudinal extension 11 exceeding at least two times a mean lateral width extension w1. The stripes are oriented with the longitudinal extension 11 in the radial direction. The trench isolation structures 400 may be separated from the inner region 110 and the outer region 120 or at least some of the trench isolation structures 400 may be in contact with the inner region 110, the outer region 120 or both. The number and/or width of the trench isolation structures 400 may increase with increasing distance to the inner region 110, such that a lateral area occupation density is roughly constant along the radial direction.

In FIG. 9, the horizontal cross-sectional area of the trench isolation structures 400 is wedge-shaped, wherein the lateral width tapers in direction of the inner region 110. In case of a horizontal charge carrier flow in the radial direction, a mean current density can be approximately uniform along the radial direction.

In FIG. 10, the horizontal cross-sectional areas of the trench isolation structures 400 have an approximately uniform lateral width extension w1 along the complete longitudinal extension 11, wherein the trench isolation structures 400 may be rounded at the lateral ends. Longitudinal axes of the trench isolation structures 400 are oriented parallel to the radial direction. The number of trench isolation structures 400 may increase with increasing distance to the inner region 110.

Figure 11:
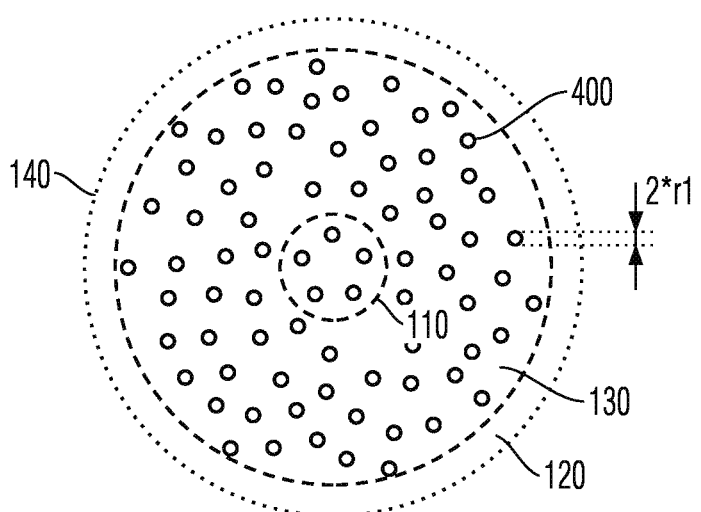
FIG. 11 is a schematic horizontal cross-sectional view of a semiconductor device according to an embodiment having trench isolation structures with circular horizontal cross-section formed in a ring-shaped transition region and a circular inner region.

FIG. 11 shows trench isolation structures 400 formed in both the transition region 130 and the inner region 110, in particular, in a portion of the inner region 110 facing the transition region 130.

Figure 12:
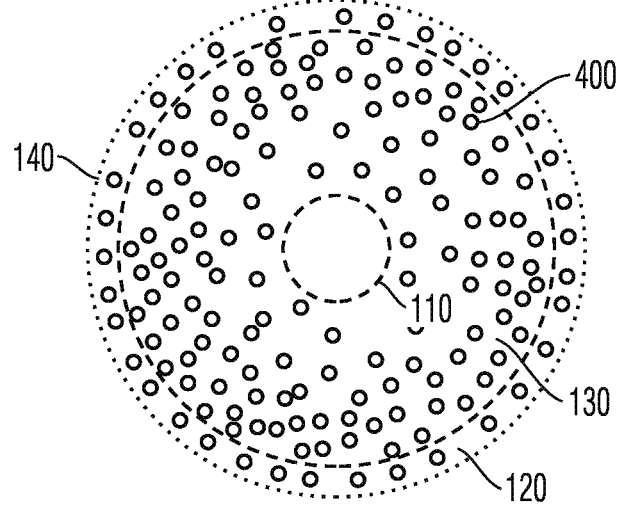
FIG. 12 is a schematic horizontal cross-sectional view of a semiconductor device according to an embodiment having trench isolation structures with circular horizontal cross-section formed in a ring-shaped transition region and an outer region.

FIG. 12 shows trench isolation structures 400 formed in both the transition region 130 and the outer region 120, particularly in a portion of the outer region 120 facing the transition region 130.

Figure 13:
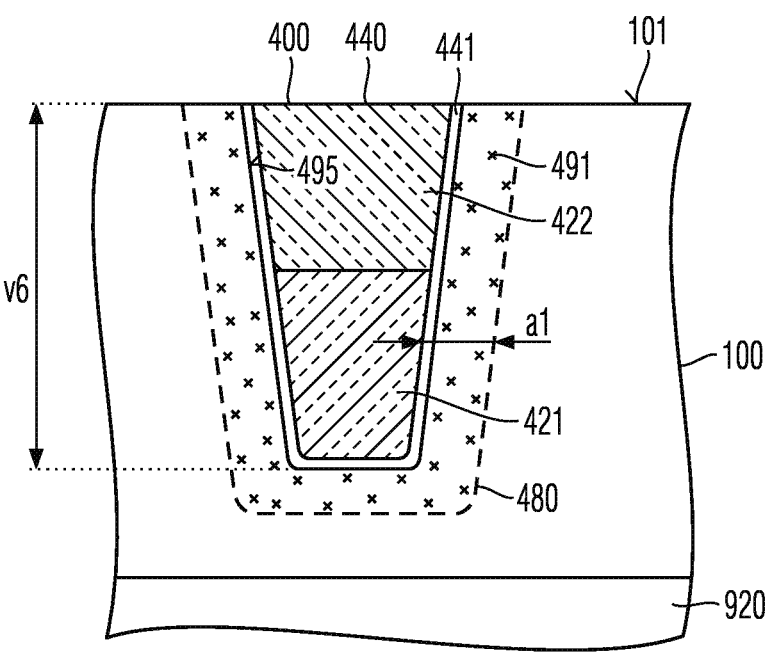
FIG. 13 is a schematic vertical cross-sectional view of a portion of a semiconductor device according to an embodiment having intrinsic recombination centers formed in the vicinity of a trench isolation structure.

FIG. 13 shows intrinsic recombination centers 491 predominantly formed in a layer portion 480 of the semiconductor layer 100 along an interface 495 between the trench isolation structure 400 and the semiconductor layer 100.

The layer portion 480 extends at approximately uniform width parallel to the interface 495. A thickness al of the layer portion 480 may be less than a vertical extension v6 of the trench isolation structure 400, along which the layer portion 480 extends. At least for a majority of the intrinsic recombination centers 491, a lateral distance between the intrinsic recombination center 491 and the nearest trench isolation structure 400 is smaller than a vertical distance between the same intrinsic recombination center 491 and the first surface 101.

The intrinsic recombination centers 491 may be or may include atomic impurities e.g. electrically active dopants such as donor and acceptor atoms, foreign atoms of a further semiconductor element, and/or electrically less active or inactive impurities. Alternatively or in addition, the intrinsic recombination centers 491 may include crystal defects in the semiconductor layer 100, e.g. bulk defects, planar defects, line defects and point defects like interstitial defects, substitutional defects and vacancy defects.

Formation of the intrinsic recombination centers 491 is combined with formation of the trench isolation structure 400.

Formation of the trench isolation structure 400 includes a process of forming a trench extending from the first surface 101 into the semiconductor layer 100, e.g. a reactive ion beam etch process. Impurity atoms like acceptor atoms, donor atoms, and/or atoms of other elements may be ion implanted, diffused from the gaseous phase or the solid phase, and/or plasma doped through the trench sidewalls.

Usual acceptor and/or donor atoms like boron (B), indium (In) phosphorus (P), and arsenic (As) locally reduce charge carrier lifetime and form doped regions contributing to a local charge balance and improving breakdown voltage and other device characteristics. Atoms of other semiconducting elements such as germanium (Ge), atoms used for generating crystal defects like argon (Ar), xenon (Xe) and/or atoms with effect on the electric state like carbon (C) or metal atoms like platinum (Pt) and/or aluminum (Al) may directly form traps for charge carriers or may generate traps for charge carries, e.g. crystal defects. For example, shallow donors like Pt atoms selectively increase recombination and limit generation of charge carriers.

A thermal treatment, e.g. a furnace anneal or an RTA (rapid thermal anneal), may follow the insertion of the impurity atoms into the semiconductor layer 100 to complete the formation of the intrinsic recombination centers 491 and the layer portion 480. A cleaning process and a process for closing the trench may follow, wherein the trench isolation structures 400 are finalized.

In the example illustrated in FIG. 13, the trench isolation structure 400 includes a sidewall layer 441 of one or more dielectric materials, e.g. thermal silicon oxide, deposited silicon oxide, silicon nitride, silicon oxynitride, doped or undoped silicate glass and/or a dielectric polymer, wherein the sidewall layer 441 lines the inner surface of the trench in which the trench isolation structure 400 is formed. The trench isolation structure 400 further includes a lower dielectric fill portion 421 and an upper dielectric fill portion 422 on the lower dielectric fill portion 421. The materials of the lower and upper dielectric fill portion 421, 422 may be different. According to another example, the trench isolation structure 400 may include one homogeneous fill portion. The sidewall layer 441, the lower dielectric fill portion 421 and the upper dielectric fill portion 422 form a dielectric portion 440 in direct contact with the semiconductor layer 100.

Figure 14:
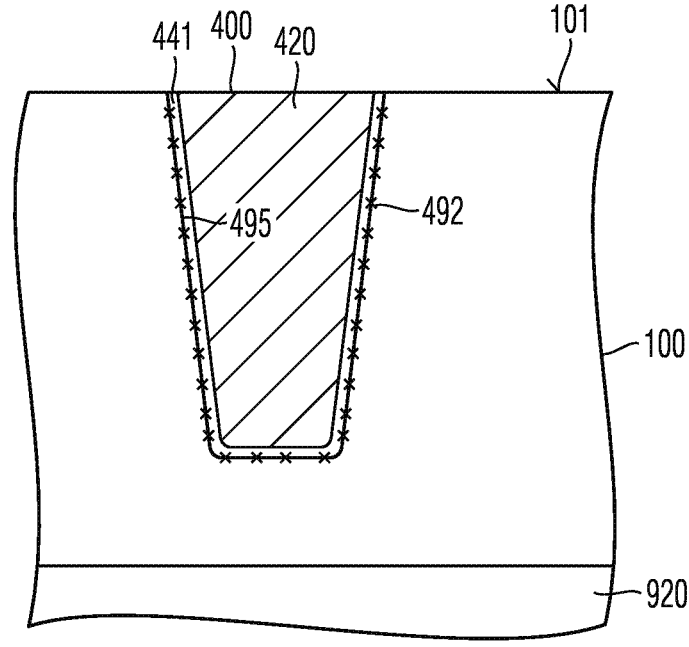
FIG. 14 is a schematic vertical cross-sectional view of a portion of a semiconductor device according to an embodiment having interface recombination centers formed along sidewalls of a trench isolation structure.

In FIG. 14 interface recombination centers 492 are formed predominantly along the interface 495 between the trench isolation structures 400 and the semiconductor layer 100. The interface recombination centers 492 may be combined with the intrinsic recombination centers 491 described with reference to FIG. 13.

The interface recombination centers 492 are in contact with both the trench isolation structure 400 and the semiconductor layer 100. The interface recombination centers 492 may include metal atoms, atomic metal clusters, metal nanoparticles or a discontinuous metal layer.

Formation of the interface recombination centers 492 is combined with formation of a trench, in which the trench isolation structure 400 is formed. In particular, the interface recombination centers 492 may be formed by placing impurity atoms like acceptor atoms, donor atoms, and/or atoms of other elements by ion implantation, diffusion from the gaseous phase or the solid phase, and/or plasma doping (PLAD) onto the trench sidewalls.

Alternatively, forming interface recombination centers 492 may include depositing a thin metal layer or metal oxide layer on the trench sidewalls and converting the deposited layer into a metal oxide layer, or into a layer containing mixed phases of metal oxide and metal clusters.

Forming interface recombination centers 492 may expose the trench sidewalls to a plasma, e.g. an argon (Ag) plasma, a nitrogen gas ($N_2$) plasma, or an oxygen gas ($O_2$) plasma, to a reactive gaseous atmosphere, e.g., e.g. air, hydrogen gas (Hz), or oxygen gas ($O_2$). Alternatively, the trench sidewalls may be exposed to a liquid, e.g. water, an acid, a solvent, or vapor, e.g. water vapor, that includes surfactants or chemicals that chemically attach to the trench sidewalls.

Forming intrinsic recombination centers 491 and/or interface recombination centers 492 may also include forming a stress layer inducing tensile or compressive mechanical stress into the semiconductor layer 100. For example, an oxide liner, a nitride liner and/or a silicon layer is deposited and the deposited liner is subjected to a thermal treatment or to UV irradiation. A cleaning process and a process for closing the trench may follow, wherein the trench isolation structures 400 are finalized.

In the example illustrated in FIG. 14, the finalized trench isolation structure 400 includes a sidewall layer 441 of one or more dielectric materials, e.g. thermal silicon oxide, deposited silicon oxide, silicon nitride, silicon oxynitride, doped or undoped silicate glass and/or a dielectric polymer, wherein the sidewall layer 441 lines the inner surface of the trench in which the trench isolation structure 400 is formed. The trench isolation structure 400 further includes a conductive fill portion 420, wherein the sidewall layer 441 separates the conductive fill portion 420 and the semiconductor layer 100.

Figure 15:
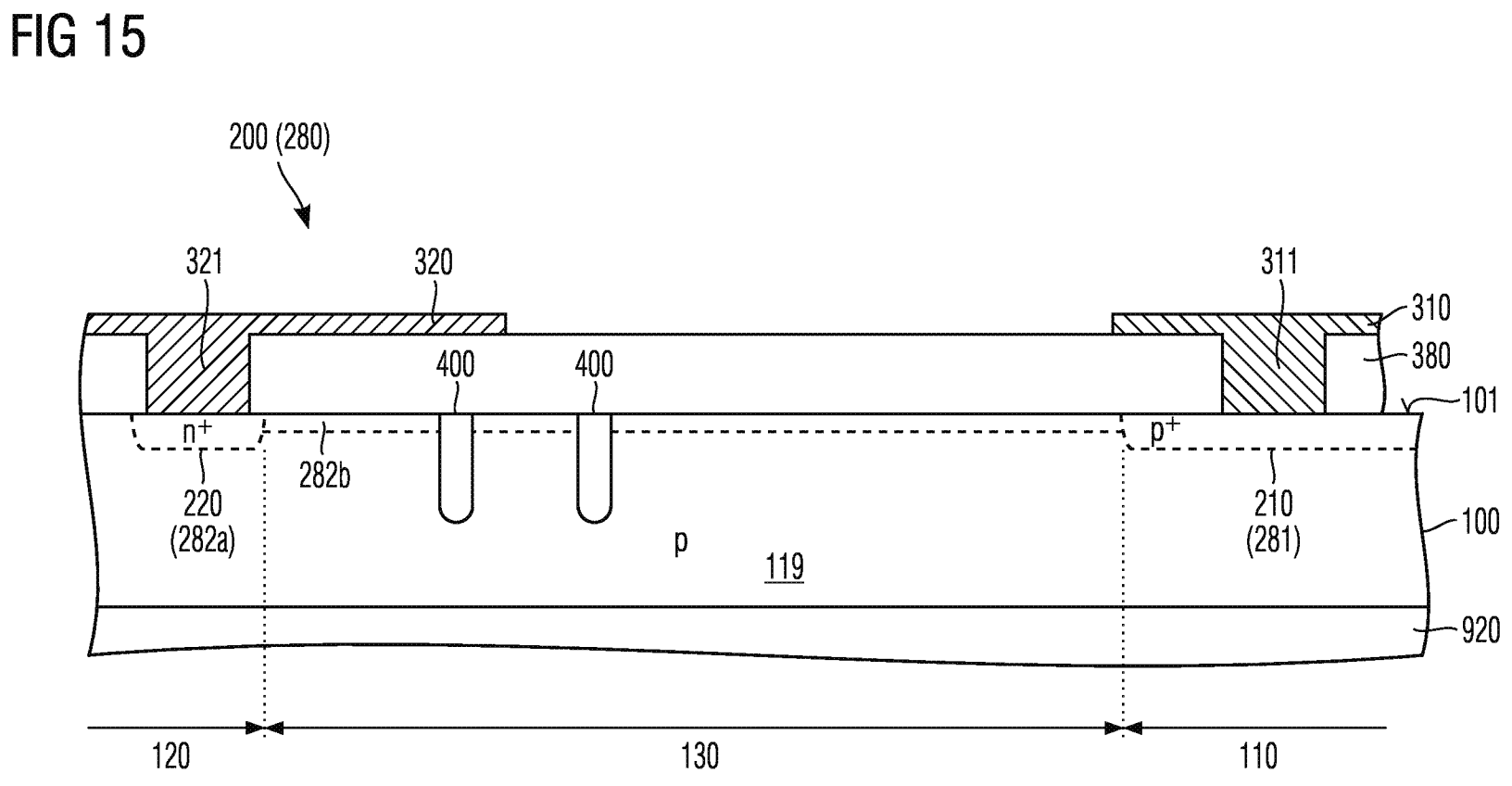

In FIG. 15 the electronic element 200 is a semiconductor diode 280. In case of a semiconductor device with half-bridge gate driver functionality, the semiconductor diode 230 may be a bootstrap diode, by way of example.

The first doped region 210 forms a first electrode region 281 extending, in the inner region 110, from a first surface 101 of the semiconductor layer 100 into the semiconductor layer 100. The second doped region 220 forms a contact part 282a of a second electrode region and extends, in the outer region 120, from the first surface 101 into the semiconductor layer 100. A bulk portion 119 of the semiconductor layer 100 separates the first doped region 210 and the second doped region 220 from the insulator layer 920.

In the illustrated embodiment, a lightly doped extension region 282b of the second electrode region extends in the transition region 130 from the first surface 101 into the semiconductor layer 100 and is in lateral contact with the first electrode region 281 and the contact part 282a of the second electrode region. According to another example (not illustrated), the first doped region 210 and the second doped region 220 are connected through a surface section of the bulk portion 119.

In the illustrated example, the first electrode region 281 forms a p doped diode anode region and the second electrode region forms an n doped diode cathode region. According to another example, the first electrode region 281 forms the n doped diode cathode region and the second electrode region forms the p doped diode anode region. An interlayer dielectric 380 formed on the first surface 101 covers the extension region 282b.

A first metallization 310 is formed on the interlayer dielectric 380 above the first doped region 210. A first contact structure 311 extends from the first metallization 310 through an opening in the interlayer dielectric 380 to the first doped region 210. The first contact structure 311 and the first doped region 210 form an ohmic contact.

A second metallization 320 is formed on the interlayer dielectric 380 above the second doped region 220. A second contact structure 321 extends from the second metallization 320 through an opening in the interlayer dielectric 380 to the second doped region 220. The second contact structure 321 and the second doped region 212 form an ohmic contact.

Trench isolations structures 400 extend from the first surface 101 through the lightly doped extension region 282b into the bulk portion 119 of the semiconductor layer 100. The trench isolation structures 400 increase the recombination rate for charge carriers present in the bulk portion 119, in particular when a diode forward current stops, e.g., when a voltage across the semiconductor diode 280 commutates. The higher recombination rate reduces reverse recovery time and improves commutation behavior.

Figure 16:
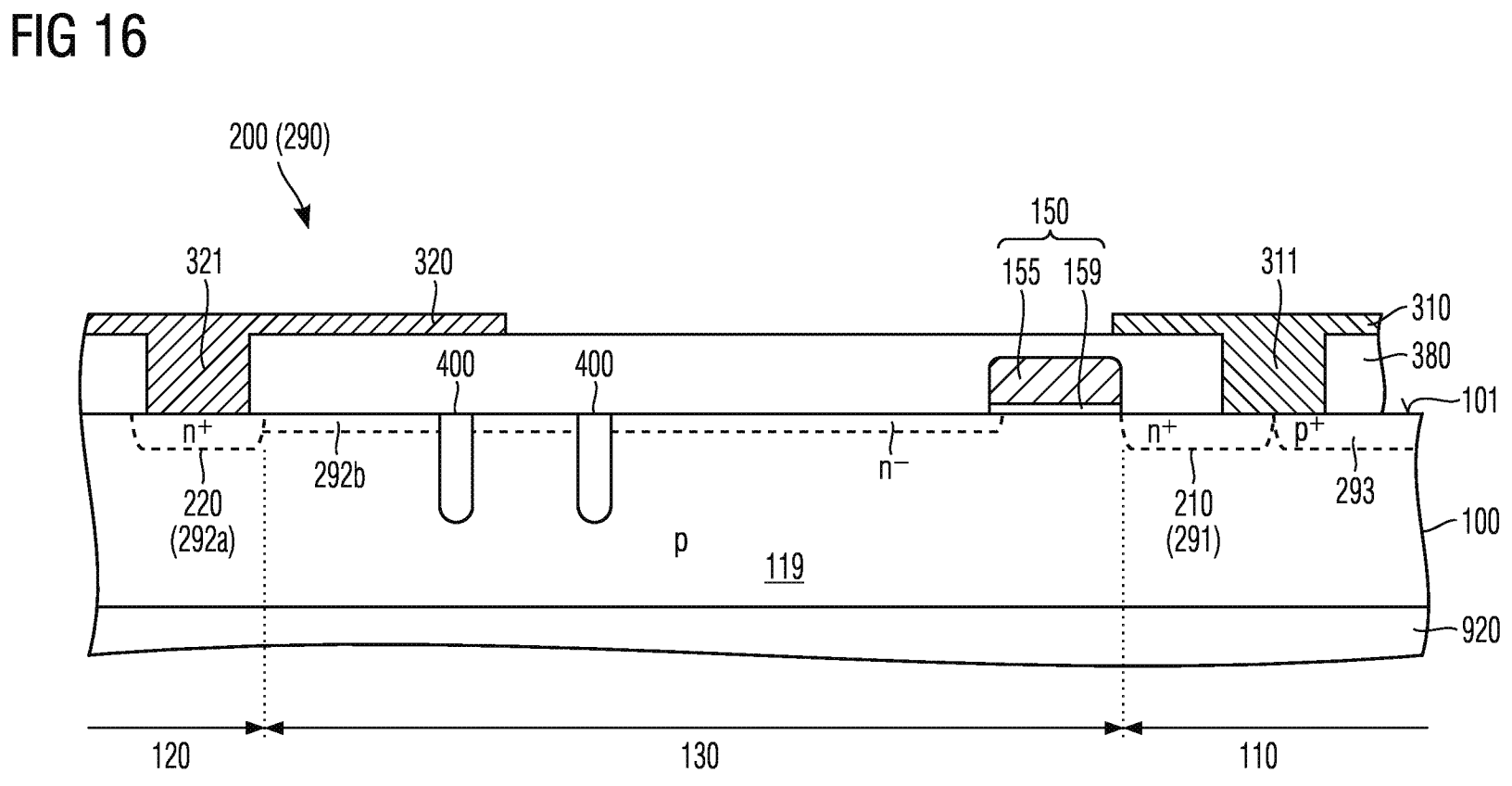

In FIG. 16, the electronic element 200 is an IGFET, for example an MOSFET 290. In case of a semiconductor device with half-bridge gate driver functionality, the MOSFET 290 may be a level-shift transistor.

The first doped region 210 forms a first source/drain region 291 extending in the inner region 110 from the first surface 101 of the semiconductor layer 100 into the semiconductor layer 100. The second doped region 220 forms a contact part 292a of a second source/drain region and extends in the outer region 120 from the first surface 101 into the semiconductor layer 100.

A lightly doped drain extension region 292b of the second source/drain region extends in the transition region 130 from the first surface 101 into the semiconductor layer 100 and is in lateral contact with the contact part 292a. A bulk/body contact region 293 extending from the first surface 101 into the semiconductor layer 100 may be formed in the inner region 110.

A bulk portion 119 of the semiconductor layer 100 separates the first source/drain region 291, the second source/drain region, and the bulk/body contact region 293 from the insulator layer 920.

The illustrated MOSFET 240 is an n-channel MOSFET with n doped source/drain regions 291, 292a, 292b, p doped bulk region 119 and p doped bulk/body contact region 293. Another example may be a p-channel MOSFET with p doped source/drain regions 291, 292a, 292b, n doped bulk region 119 and n doped bulk/body contact region 293.

A gate structure 150 is formed in the transition region 130 on the first surface 101 between the drain extension region 292b and the first source/drain region 291. The gate structure 150 includes a conductive gate electrode 155 and a gate dielectric 159 separating the gate electrode 155 and the semiconductor layer 100.

In the illustrated embodiment, a surface section of the bulk portion 119 forms a body region of the MOSFET 290. In the on-state of the MOSFET 290, a conductive charge carrier channel forms in the body region directly below the gate dielectric 159 and connects the first source/drain region 291 and the lightly doped drain extension region 292b of the second source/drain region. According to another example (not illustrated), a p doped well extending from the first surface 101 into the semiconductor layer 100 may form the body region.

An interlayer dielectric 380 formed on the first surface 101 covers the gate structure 150 and the drain extension region 292b.

A first metallization 310 is formed on the interlayer dielectric 380 above the first doped region 210. A first contact structure 311 extends from the first metallization 310 through an opening in the interlayer dielectric 380 to the first doped region 210. The first contact structure 311 and the first doped region 210 form an ohmic contact and, in addition, the first contact structure 311 and the bulk/body contact region 293 may form an ohmic contact.

A second metallization 320 is formed on the interlayer dielectric 380 above the second doped region 220. A second contact structure 321 extends from the second metallization 320 through an opening in the interlayer dielectric 380 to the second doped region 220. The second contact structure 321 and the second doped region 220 form an ohmic contact.

Trench isolations structures 400 extend from the first surface 101 through the lightly doped drain extension region 292b into the bulk portion 119 of the semiconductor layer 100. The trench isolation structures 400 increase the recombination rate for charge carriers present in the bulk portion 119, when a transistor current stops, i.e., when the transistor turns off. The higher recombination rate reduces switching losses.

Figure 17:
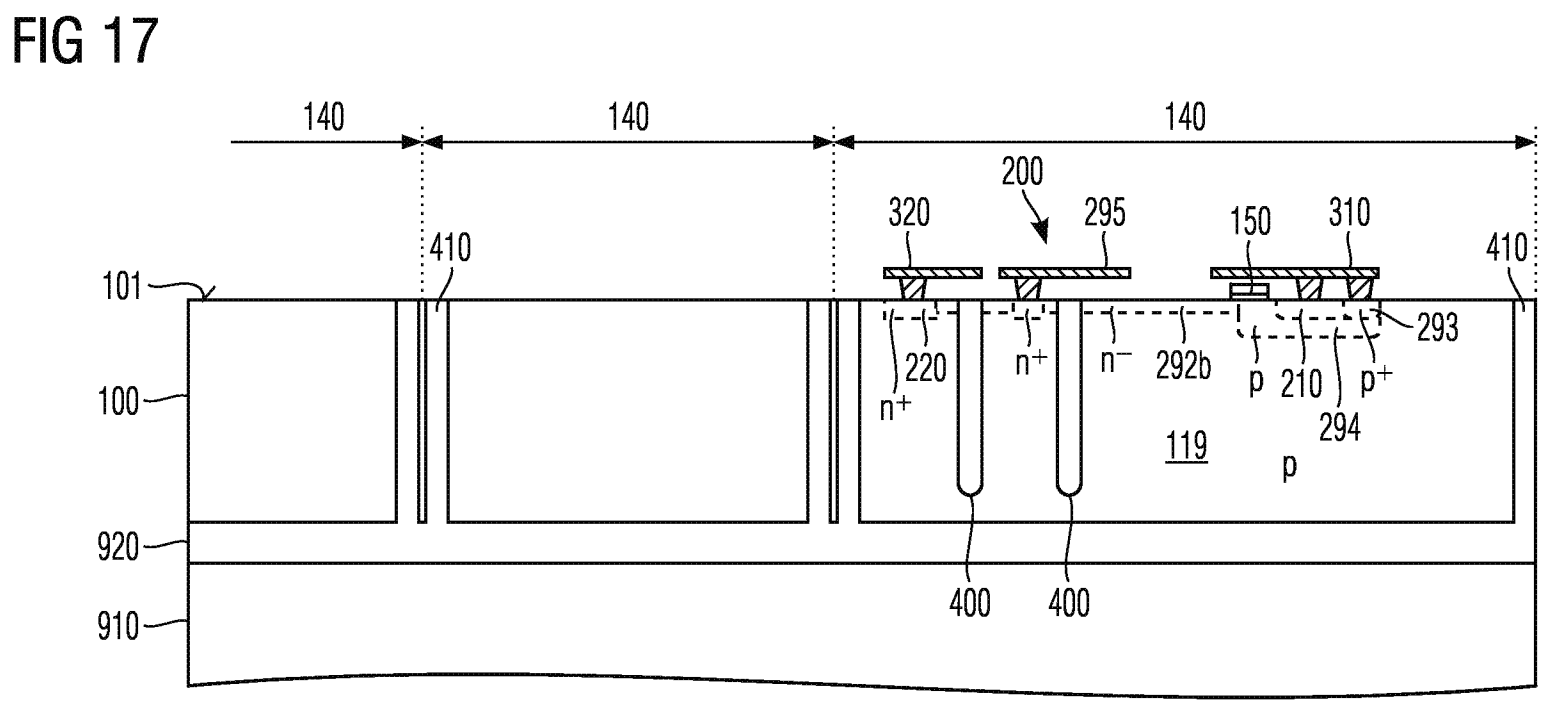

FIG. 17 shows a semiconductor layer 100 including several laterally separated element regions 140, wherein the semiconductor layer 100 is part of an SOI structure as described with reference to FIG. 6. Element isolation trenches 410 extending from the first surface 101 down to or into the insulator layer 920 form frames that laterally separate the element regions 140.

Each element region 140 includes an isolated semiconductor island. The element region 140 on the right includes an electronic element 200 similar to that described with reference to FIG. 16, wherein the electronic element 200 further includes a p doped well 294 extending from the first surface 101 into the semiconductor layer 100, and wherein a portion of the p doped well 294 forms the transistor body region. In addition, the electronic element 200 includes a field plate structure 295 that includes a more heavily doped section of the drain extension region 292b and a conductive structure connected to the heavily doped section. The electronic element 200 may be an HV MOSFET with a voltage blocking capability greater than 200V.

In other element regions 140, logic circuits may be formed that operate at supply voltages of less than 5V.

Figure 18:
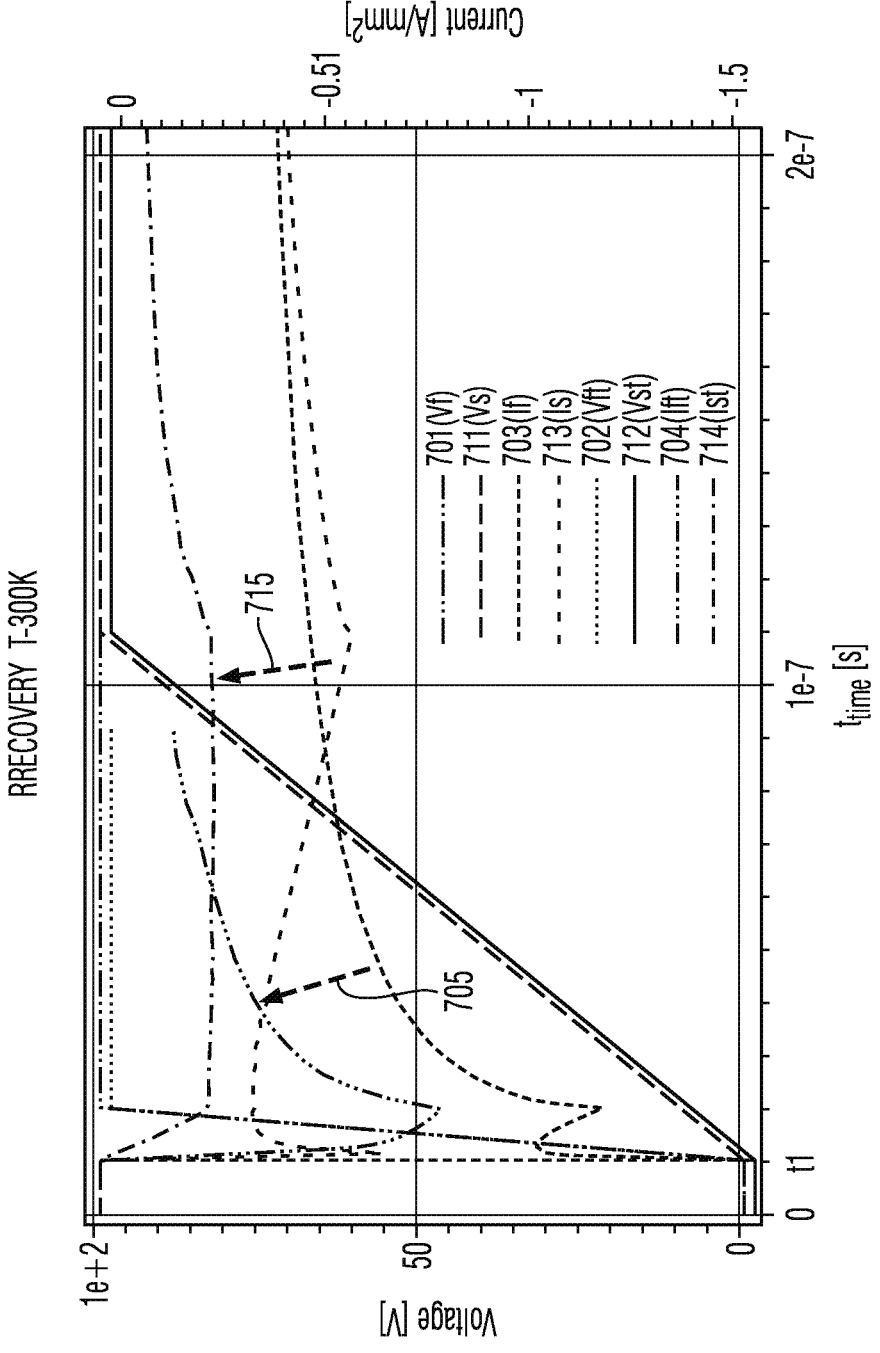
FIG. 18 is a schematic diagram for comparing the switching behavior of a semiconductor device according to the embodiments with a comparative example to discuss effects of the embodiments.

FIG. 18 shows simulation results for the effect of trench isolation structures on the commutation behavior of a 1200V semiconductor diode with rectangular active area. A mean forward current density is 0.05 A/mm$^2$.

All trench isolation structures have approximately the same shape and size, wherein the trench isolation structures are stripe-shaped with a lateral length extension of 90 μm and a lateral width extension of 3 μm. The trench isolation structures are oriented with the longitudinal axes parallel to the connection line between anode contact region and cathode contact region and are arranged parallel to each other at a regular center-to-center distance of 10 μm.

At t=t1, the semiconductor diode changes from the forward conducting state into the reverse blocking state.

Line 701 shows a fast voltage ramp applied to a comparative semiconductor diode without trench isolation structures. Line 703 shows the corresponding diode current for the fast voltage ramp applied to the comparative semiconductor diode. Line 711 shows a slow voltage ramp applied to the comparative semiconductor diode. Line 713 shows the corresponding diode current for the slow voltage ramp applied to the comparative semiconductor diode.

Line 702 shows the fast voltage ramp applied to the semiconductor diode that includes the trench isolation structures. Line 704 shows the corresponding diode current for the fast voltage ramp applied to the semiconductor diode with trench isolation structures. Line 712 shows the slow voltage ramp applied to the semiconductor diode with trench isolation structures. Line 714 shows the corresponding diode current for the slow voltage ramp applied to the semiconductor diode with the trench isolation structures.

Arrow 705 indicates the reverse recovery current reduction achieved by the trench isolation structures for the fast voltage ramp. Arrow 715 indicates the reverse recovery current reduction achieved by the trench isolation structures for the slow voltage ramp.

Figure 19A:
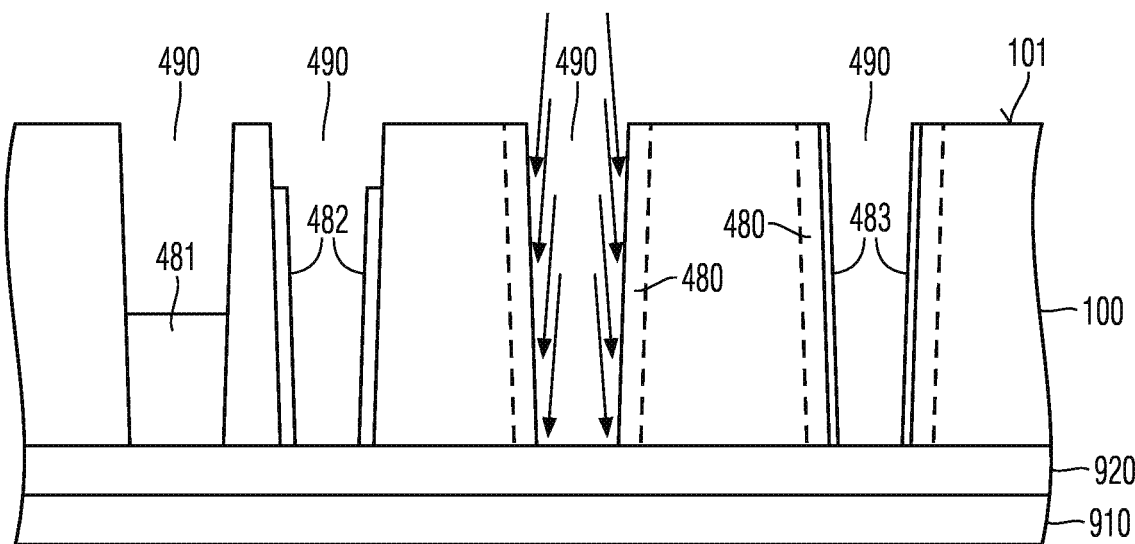
FIG. 19A and FIG. 19B are schematic vertical cross-sectional views showing examples for forming intrinsic and interface recombination centers by using trenches for the trench isolation structures in accordance with further embodiments.
Figure 19B:
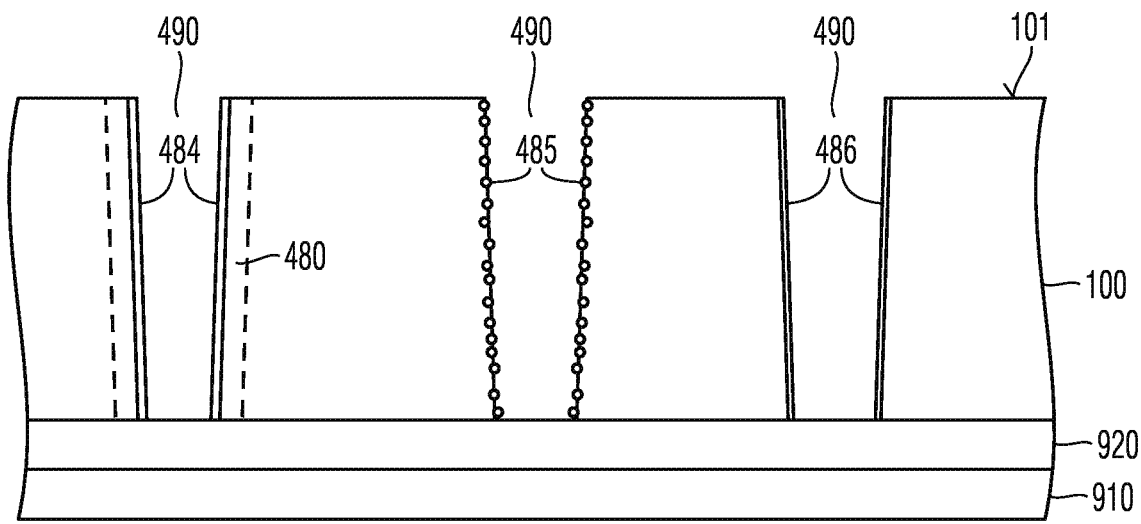

FIG. 19A and FIG. 19B schematically illustrate some examples of forming intrinsic and/or interface recombination centers using trenches 490 extending from a first surface 101 into a semiconductor layer 100 of an SOI structure as described above with reference to FIG. 6. According to the illustrated embodiments, the trenches 490 extend to the insulator layer 920, but the trenches 490 can just as easily terminate well above the insulator layer 920. For conciseness, various examples are combined into one figure.

The trench 490 on the left hand side of FIG. 19A is partially filled with an auxiliary structure 481 that facilitates depth selectivity for a process of forming intrinsic and/or interface recombination centers. For example, the auxiliary structure 481 may mask the lower portion of the trench sidewalls and the trench bottom against ion implantation or in-diffusion of impurity atoms from the gaseous phase, and/or against exposure to plasma, an atmosphere, or chemical reactants that modify the trench sidewalls. Alternatively, the auxiliary structure 481 may contain impurity atoms and may be used as impurity source for diffusing impurity atoms selectively through the trench bottom and the trench sidewall portions in the lower trench portion. For example, the auxiliary structure 481 may include spin-coated silicate glass containing boron and/or phosphor atoms. The auxiliary structure 481 may be removed prior to completing formation of the trench isolation structure or may become part of the finalized trench isolation structure.

The second trench 490 in FIG. 19A includes a recessed liner 482 that facilitates depth selectivity for a process of forming intrinsic and/or interface recombination centers. Forming the recessed liner may include a conformal deposition process and/or an oxidation process and a subsequent anisotropic etch. The recessed liner 482 may mask the lower portion of the trench sidewalls against ion implantation or in-diffusion of impurity atoms from the gaseous phase, and/or against exposure to plasma, an atmosphere, or chemical reactants that modify the trench sidewalls. Alternatively, the recessed liner 482 may contain impurity atoms and may be used as impurity source for diffusing impurity atoms selectively through the trench sidewall portions covered by the recessed liner 482.

An ion implantation process implants impurity atoms, e.g. damage atoms, donor atoms and/or acceptor atoms through the trench sidewalls and, if applicable, through the trench bottom of the third trench 490 in FIG. 19A. The implanted impurities and/or crystal defects generated by implanted damage atoms form intrinsic recombination centers predominantly in a layer portion 480 of the semiconductor layer 100, wherein the layer portion 480 extends parallel to the trench sidewalls.

The trench 490 on the right hand side of FIG. 19A is lined with a stress layer 483 that induces a tensile of compressive stress into a layer portion 480 of the semiconductor layer 100. The stress layer 483 may include an oxide liner, a nitride liner and/or a silicon layer that is subjected to a heat treatment or UV irradiation after deposition.

The trench 490 on the left hand side in FIG. 19B includes an auxiliary liner 484 that contains impurity atoms and that is used as impurity source for diffusing impurity atoms through the trench sidewall into a layer portion 480 of the semiconductor layer 100.

The trench 490 in the center of FIG. 19B includes metal clusters 485 or metal nanoparticles that may be formed by depositing a thin metal liner and subjecting the deposited metal liner to a heat treatment and/or exposing the deposited metal liner to an etchant.

The trench 490 on the right hand side in FIG. 19B includes a conditioned surface layer 486 obtained by exposing the trench sidewalls to a plasma, e.g. an argon (Ag) plasma, a nitrogen gas ($N_2$) plasma, or an oxygen gas ($O_2$) plasma, to a reactive gaseous atmosphere, e.g. air, hydrogen gas ($H_2$), or oxygen gas ($O_2$), to a liquid, e.g. water, an acid, a solvent, or vapor, e.g. water vapor, that includes surfactants or chemicals chemically modifying the trench sidewalls or attaching to the trench sidewalls.

Figure 20:
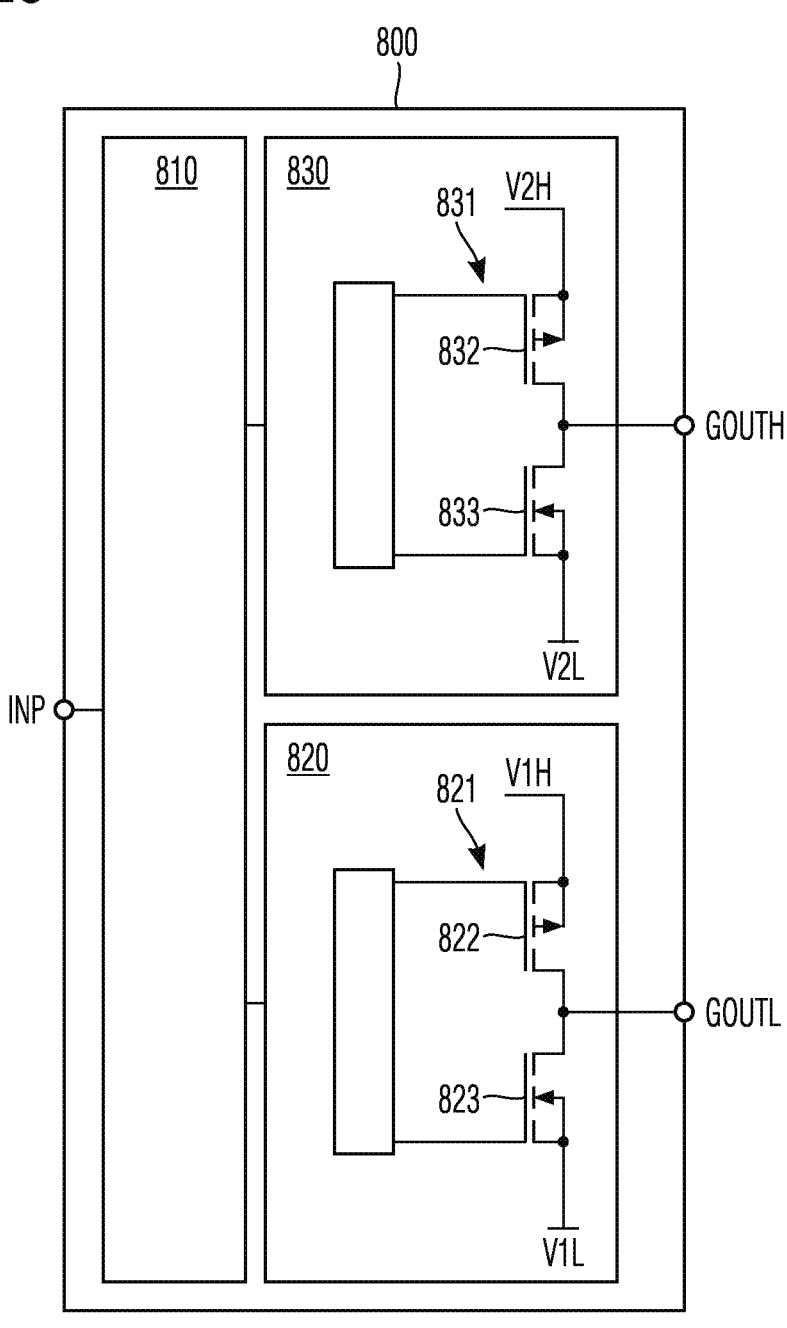
FIG. 20 is a schematic block diagram of a gate driver circuit with trench isolation structures according to another embodiment.

FIG. 20 shows building blocks of a gate driver circuit 800. The gate driver circuit 800 enables a micro-controller or digital signal processor to efficiently turn on and turn off power semiconductor switches such as IGBTs or MOSFETs in power conversion circuits and motor control application.

The gate driver circuit 800 is configured as a half-bridge gate driver device that includes a first gate driver stage 820 in a first voltage domain, a second gate driver stage 830 in a second voltage domain, and an input stage 810 in a third voltage domain. The input stage 810 receives an input signal at one or more input terminals INP. The input signal may include square pulses and may be received from a pulse width modulator circuit. The input stage 810 may pre-process the input signal and may transfer the pre-processed input signal to the first and second gate driver stages 820, 830 which may be electrically separated from the input stage 810. The input stage 810 may include logic circuits operating with a supply voltage of at most 5V.

The first gate driver stage 820 includes a first buffer stage 821. In response to the received pre-processed input signal, the first buffer stage generates and drives a first gate signal for a first voltage controlled switching device, e.g. the low-side switch of a half-bridge assembly, and outputs the first gate signal at a first gate output terminal GOUTL.

The second gate driver stage 830 includes a second buffer stage 831. In response to the received pre-processed input signal, the second gate driver stage 830 generates and drives a second gate signal for a second voltage controlled switching device, e.g. the high-side switch of a half-bridge assembly, and outputs the second gate signal at a second gate output terminal GOUTH.

The first buffer stage 821 and/or the second buffer stage 831 include an inverter stage, e.g. a push-pull driver, with the source/drain paths of a p-MOSFET 822, 832 and an n-MOSFET 823. 833 electrically connected in series between a high potential line V1H, V2H and a low potential line V1L, V2L of the respective stage.

The network node between the p-MOSFET 822 and n-MOSFET 823 of the first buffer stage 821 is electrically connected with the first gate output terminal GOUTL. The network node between the p-MOSFET 832 and n-MOSFET 833 of the second buffer stage 831 is electrically connected with the second gate output terminal GOUTH.

In each buffer stage 821, 831, the p-MOSFET 822, 832 and the n-MOSFET 823, 833 are alternatingly turned on and off, wherein at each point in time only one of the p-MOSFET 822, 832 and the n-MOSFET 823, 833 of the same buffer stage 821, 831 is in the on-state.

The gate driver circuit 800 may further include a bootstrap diode for supplying the second gate driver stage 830.

The gate driver circuit 800 may include one or more level shift transistors, between the input stage 810 and the first gate driver stage 820 and/or between the input stage 810 and the second gate driver stage 830, and/or between first gate driver stage 820 and the second gate driver stage 830.

The high voltage semiconductor device may be a half bridge gate driver circuit with a first HV part in a first voltage domain, a second HV part in a second voltage domain, and with a CMOS part. The CMOS part includes an input circuit for receiving and preprocessing low-voltage level input signals. Each HV part includes a driver stage, e.g. a push-pull stage or inverter stage with two MOSFETs electrically connected in series between a high voltage line and a reference voltage line.

The CMOS part and electronic elements of the HV part, e.g. the bootstrap diode and/or the level shift transistors may be formed in separated element regions 140 as described with reference to the previous figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor layer comprising an element region, wherein the element region comprises an inner region, an outer region on opposite sides of the inner region, and a transition region laterally separating the inner region and the outer region;
   an electronic element comprising a first doped region formed in the inner region and a second doped region formed in the outer region; and
   laterally separated trench isolation structures at least in the transition region, wherein each trench isolation structure extends from a first surface of the semiconductor layer into the semiconductor layer, and
   wherein at least some of the trench isolation structures are fully surrounded by the transition region.

2. The semiconductor device of claim 1, further comprising:
   an insulator layer, wherein the semiconductor layer is formed on the insulator layer.

3. The semiconductor device of claim 1, wherein the outer region surrounds the inner region.

4. The semiconductor device of claim 1, further comprising:
   an element isolation trench surrounding the element region.

5. The semiconductor device of claim 1, further comprising:
   a further element region surrounded by the inner region.

6. The semiconductor device of claim 1, wherein a vertical extension of at least some of the trench isolation structures is greater than a vertical extension of the first doped region and a vertical extension of the second doped region.

7. The semiconductor device of claim 1, wherein a roundness of a horizontal cross-sectional area of the trench isolation structures is at least 0.4.

8. The semiconductor device of claim 1, wherein a horizontal cross-sectional area of the trench isolation structures is a stripe with a lateral longitudinal extension that exceeds at least two times a mean lateral width extension.

9. The semiconductor device of claim 1, wherein at least one of the trench isolation structures is formed in the inner region or in the outer region.

10. The semiconductor device of claim 1, further comprising:
   intrinsic recombination centers formed in the semiconductor layer in a layer portion along an interface between the trench isolation structures and the semiconductor layer.

11. The semiconductor device of claim 1, further comprising:
   interface recombination centers formed along an interface between the trench isolation structures and the semiconductor layer.

12. The semiconductor device of claim 1, wherein the trench isolation structures include a dielectric portion in direct contact with the semiconductor layer.

13. The semiconductor device of claim 1, wherein the electronic element comprises a portion of the transition region that spans from the first doped region to the second doped region, and wherein at least some of the trench isolation structures are fully surrounded by the portion of the transition region.

14. A method of forming a semiconductor device, the method comprising:
   forming a semiconductor layer comprising an element region, wherein the element region comprises an inner region, an outer region on opposite sides of the inner region, and a transition region laterally separating the inner region and the outer region;
   forming an electronic element comprising a first doped region formed in the inner region and a second doped region formed in the outer region, wherein the electronic element is configured to temporarily block a voltage applied between the first doped region and the second doped region;
   forming laterally separated trenches extending from a first surface of the semiconductor layer into the transition region; and
   forming trench isolation structures in the trenches such that at least some of the trench isolation structures are fully surrounded by the transition region.

15. The method of claim 14, further comprising:
   forming intrinsic recombination centers by introducing atoms through sidewalls of the trenches.

16. The method of claim 14, further comprising:
   forming a layer comprising a metal on sidewalls of the trenches.

17. The method of claim 14, further comprising:
   forming a stress layer on sidewalls of the trenches, wherein the stress layer induces mechanical stress into portions of the semiconductor layer around the trenches.

18. A semiconductor device, comprising:
   a semiconductor layer comprising an element region, wherein the element region comprises an inner region, an outer region on opposite sides of the inner region, and a transition region laterally separating the inner region and the outer region;
   an electronic element comprising a first doped region formed in the inner region and a second doped region formed in the outer region; and
   laterally separated trench isolation structures at least in the transition region, wherein each trench isolation structure extends from a first surface of the semiconductor layer into the semiconductor layer, and
   wherein a vertical extension of at least some of the trench isolation structures is greater than a vertical extension of the first doped region and a vertical extension of the second doped region.

19. A semiconductor device, comprising:
   a semiconductor layer comprising an element region, wherein the element region comprises an inner region, an outer region on opposite sides of the inner region, and a transition region laterally separating the inner region and the outer region;
   an electronic element comprising a first doped region formed in the inner region and a second doped region formed in the outer region;
   laterally separated trench isolation structures at least in the transition region; and
   intrinsic recombination centers formed in the semiconductor layer in a layer portion along an interface between the trench isolation structures and the semiconductor layer and/or interface recombination centers formed along the interface between the trench isolation structures and the semiconductor layer,
   wherein each trench isolation structure extends from a first surface of the semiconductor layer into the semiconductor layer.

* * * * *